United States Patent
Capps et al.

(10) Patent No.: US 8,039,739 B1
(45) Date of Patent: Oct. 18, 2011

(54) INDIVIDUALLY ENCAPSULATED SOLAR CELLS AND SOLAR CELL STRINGS

(75) Inventors: Philip Capps, Mountain View, CA (US); Paul Adriani, Palo Alto, CA (US); James R. Sheats, Palo Alto, CA (US)

(73) Assignee: Nanosolar, Inc., San Jose, CA (US)

( * ) Notice: Subject to any disclaimer, the term of this patent is extended or adjusted under 35 U.S.C. 154(b) by 575 days.

(21) Appl. No.: 11/462,359

(22) Filed: Aug. 3, 2006

Related U.S. Application Data

(63) Continuation-in-part of application No. 11/460,613, filed on Jul. 27, 2006.

(60) Provisional application No. 60/806,096, filed on Jun. 28, 2006, provisional application No. 60/804,571, filed on Jun. 12, 2006, provisional application No. 60/804,570, filed on Jun. 12, 2006, provisional application No. 60/746,961, filed on May 10, 2006, provisional application No. 60/746,626, filed on May 5, 2006.

(51) Int. Cl.
*H01L 31/048* (2006.01)
*H01L 31/0203* (2006.01)

(52) U.S. Cl. ............... 136/259; 136/252; 136/251
(58) Field of Classification Search .......... None
See application file for complete search history.

(56) References Cited

U.S. PATENT DOCUMENTS

| | | | | |
|---|---|---|---|---|
| 5,419,782 A * | 5/1995 | Levine et al. | ............. | 136/246 |
| 5,656,098 A * | 8/1997 | Ishikawa et al. | ............. | 136/256 |
| 5,681,666 A * | 10/1997 | Treger et al. | ............. | 429/90 |
| 6,268,014 B1 | 7/2001 | Eberspacher | | |
| 2001/0011552 A1* | 8/2001 | Morizane et al. | ............. | 136/251 |
| 2001/0054262 A1 | 12/2001 | Nath | | |
| 2002/0050287 A1* | 5/2002 | Yamada et al. | ............. | 136/251 |
| 2005/0062174 A1* | 3/2005 | Ingle | ............. | 257/788 |
| 2007/0000537 A1* | 1/2007 | Leidholm et al. | ............. | 136/252 |

FOREIGN PATENT DOCUMENTS

WO   WO 2008/014492 A3   12/2008

* cited by examiner

*Primary Examiner* — Kaj K Olsen
*Assistant Examiner* — Kourtney R Salzman
(74) *Attorney, Agent, or Firm* — The Mueller Law Office, P.C.

(57) ABSTRACT

Methods and devices are provided for improved environmental protection for photovoltaic devices and assemblies. In one embodiment, the device comprises of an individually encapsulated solar cell, wherein the encapsulated solar cell includes at least one protective layer coupled to at least one surface of the solar cell. The protective layer has a chemical composition that prevents moisture from entering the solar cell and wherein light passes through the protective layer to reach an absorber layer in the solar cell.

28 Claims, 11 Drawing Sheets

INDIVIDUALLY ENCAPSULATED SOLAR CELLS AND SOLAR CELL STRINGS

CROSS-REFERENCE TO RELATED APPLICATIONS

This patent application claims the benefit of priority to commonly assigned, copending U.S. Provisional Application Ser. No. 60/746,626 filed May 5, 2006; commonly assigned, copending U.S. Provisional Application Ser. No. 60/746,961 filed May 10, 2006; commonly assigned, copending U.S. Provisional Application Ser. No. 60/804,570 filed Jun. 12, 2006; commonly assigned, copending U.S. Provisional Application Ser. No. 60/804,571 filed Jun. 12, 2006; and commonly assigned, copending U.S. Provisional Application Ser. No. 60/806,096 filed Jun. 28, 2006. This application is also a continuation-in-part of copending U.S. patent application Ser. No. 11/460,613 filed Jul. 27, 2006. All of the foregoing applications are fully incorporated herein by reference for all purposes.

FIELD OF THE INVENTION

This invention relates generally to solar cells, and more specifically, to protective layers used to protect solar cells, solar cell strings, and/or solar cell modules against environmental exposure damage.

BACKGROUND OF THE INVENTION

Solar cells and solar modules convert sunlight into electricity. These devices are traditionally mounted outdoors on rooftops or in wide-open spaces where they can maximize their exposure to sunlight. Unfortunately, this type of outdoor placement also subjects the solar cells and solar cell modules to substantially constant weather and moisture exposure. Due to this constant and extended exposure to the elements, solar cells and solar cell modules are preferably designed to have sufficient environmental protection to provide many years of stable and reliable operation without failure due to moisture damage or other exposure related damage. Even small solar cells for use with consumer electronic devices should have rugged environmental protection as these devices are by their nature also generally used outdoors or in areas of sun exposure where they can maximize their electric generating ability.

A central challenge in finding suitable encapsulating material for use with solar cells is finding one material that has best-in-class qualities for the many properties desired in a good environmental encapsulant. There may be some materials that provide good moisture barrier qualities but are not sufficiently transparent to pass light down to the absorber layer in the solar cell. Other layers may be good at moisture and transparent, but discolor over time and reduces transparency with ongoing use.

Traditional solar cell modules address the weatherproofing issue by using a glass sheet of sufficient size to cover all the cells in a solar module. Although glass provides a very durable and weather resistant layer, it does so at the cost of being expensive, heavy, and rigid. Glass modules are also generally more challenging to manufacture in a high-throughput manner. The use of glass also typically involves using some type of edge tape to prevent moisture from entering laterally. This further complicates the manufacturing process as it is difficult to avoid gaps in the barrier, especially at the interfaces of the edge tape and the glass as well as the edge tape and any bottom layer.

Furthermore, thin-film solar cells are more sensitive to moisture exposure than traditional silicon based solar cells. It is generally undesirable to expose any type of solar cell to direct moisture contact. This is even more true for thin-film solar cells. Hence, it is important that weatherproofing and moisture protection for thin-film solar cells equal or exceed those levels provided to silicon based cells.

Due to the aforementioned issues, improved environmental protection configurations are desired for solar cells, solar cell modules, and/or similar photovoltaic devices.

SUMMARY OF THE INVENTION

Embodiments of the present invention address at least some of the drawbacks set forth above. The present invention provides for the improved environmental protection of solar cells generally and thin-film solar cells in particular. It should be understood that this invention is generally applicable to any type of solar cell, whether they are rigid or flexible in nature or the type of material used in the absorber layer. Embodiments of the present invention may be adapted for roll-to-roll and/or batch manufacturing processes. At least some of these and other objectives described herein will be met by various embodiments of the present invention.

The present invention provides methods and devices for improved environmental protection for photovoltaic devices and assemblies. In one embodiment, the device comprises of an individually encapsulated solar cell, wherein the encapsulated solar cell includes at least one protective layer coupled to at least one surface of the solar cell. The protective layer has a chemical composition that prevents moisture from entering the solar cell and wherein light passes through the protective layer to reach an absorber layer in the solar cell. It should be understood that the protective layer described herein can be applied to any type of photovoltaic device and is not limited to thin-film, organic, or silicon based solar cells. Individual encapsulation of the cell and/or cell string can effectively address the issue of lateral ingress of vapor between the top and bottom protective sheets.

In one embodiment of the present invention, a device is provided comprised of an individually encapsulated solar cell, wherein the encapsulated solar cell includes at least one protective layer coupled to at least one surface of the solar cell. The protective layer has a chemical composition that substantially prevents moisture from entering the solar cell, wherein light passes through the protective layer to reach an absorber layer in the solar cell.

For any of the embodiments described herein, the following may also apply. In one embodiment, the protective layer may be comprised of a substantially organic material. In another embodiment, the protective layer may be comprised of a heat curable hardcoat material. The protective layer may be a radiation curable hardcoat material. The protective layer may be a UV curable hardcoat material. The protective layer may be a clear, non-yellowing silicone-based hardcoat material. The protective layer may be a curable polyacrylate hardcoat containing silica particles.

For any of the embodiments described herein, the following may also apply. The protective layer may include an acrylic composition containing at least one filler material, at least one multifunctional acrylic material, and at least one higher functional acrylic material. The filler material may be silica, functionalized silica, and/or acrylate functionalized silica. The filler material may be in the form of nanoparticles having maximum dimensions of about 1 micron or less. The filler material may be a silicone based material. The filler material may include a colloidal silica and a silane selected from the group consisting of: 3-methacryloxypropyltrimethoxysilane, 3-acryloxypropyltrimethoxysilane, 2-methacryloxyethyltrimethoxysilane, 2-acryloxyethyltrimethoxysilane, 3-methacryloxypropyltriethoxysilane, 3-acryloxypropyltriethoxysilane, 2-methacryloxyethyltriethoxysilane, 2-acryloxyethyltriethoxysilane, 3-glycidoxypropyltrimethoxysilane, 2-glycidoxyethyltrimethoxysilane, 3-glycidoxypropyltriethoxysilane, 2-glycidoxyethyltriethoxysilane, and/or combinations thereof.

For any of the embodiments described herein, the multifunctional acrylic material may be selected from the group of: diacrylates, such as 1,6-hexanediol diacrylate, 1,4-butanediol diacrylate, ethylene glycol diacrylate, diethylene glycol diacrylate, tetraethylene glycol diacrylate, tripropylene glycol diacrylate, neopentyl glycol diacrylate, 1,4-butanediol dimethacrylate, poly(butanediol) diacrylate, tetraethylene glycol dimethacrylate, 1,3-butylene glycol diacrylate, triethylene glycol diacrylate, triisopropylene glycol diacrylate, polyethylene glycol diacrylate, and bisphenol; dimethacrylate; triacrylates such as trimethylolpropane triacrylate, trimethylolpropane trimethacrylate, pentaerythritol monohydroxy triacrylate, and trimethylolpropane triethoxy triacrylate; tetraacrylates, such as pentaerythritol tetraacrylate and di-trimethylolpropane tetraacrylate; and pentaacrylates, such as dipentaerythritol; (monohydroxy) pentaacrylate, or combinations thereof.

For any of the embodiments described herein, the following may also apply. The higher multifunctional acrylic material is selected from the group consisting of: triacrylates such as trimethylolpropane triacrylate, trimethylolpropane trimethacrylate, pentaerythritol monohydroxy triacrylate, and trimethylolpropane triethoxy triacrylate; tetraacrylates, such as pentaerythritol tetraacrylate and di-trimethylolpropane tetraacrylate; and pentaacrylates, such as dipentaerythritol; and/or (monohydroxy) pentaacrylate. Combinations of any of the foregoing is also envisioned. It should be understood that an initiator and/or a photoinitiator may be combined in the hardcoat. The photoinitiator may be selected from the group consisting of: 2-hydroxy-2-methyl-1-phenyl-propan-1-one or 2,2-dimethoxy-2-phenyl-acetyl-phenone, and/or combinations thereof. The uncured hardcoat may also include an anaerobic gelation inhibitor. The anaerobic gelation inhibitor may be selected from the group consisting of: 2,2,6,6-tetramethylpiperidinyloxy, 4-hydroxy-2,2,6,6-tetramethylpiperidinyloxy, bis(4-hydroxy-2,2,6,6-tetramethylpiperidinyloxy sebacate diradical, 2,2-diphenyl-1-picrylhydrazyl, 1,3,5-triphenylverdazyl, 1-nitroso-2-naphthol, a nitrone, methylhydroquinone, galvinoxyl, 4-hydroxy-2,2,6,6-tetramethylpiperidinyloxy, N-t-butyl-α-phenyl nitrone, 2,2-diphenyl-1-picryl-hydrazyl hydrate (DPPH), and/or combinations thereof. The hardcoat precursor may also include a diluent. The diluent may be selected from the group consisting of: isopropanol, t-butanol, n-propanol, n-butanol, methanol, ethanol, ethylene glycol n-butyl ether, and mixtures thereof.

For any of the embodiments described herein, the following may also apply. In one embodiment, the protective layer may have a composition comprised of 2 at. % silicon, 32 at. % carbon, 17 at. % oxygen, and 48 at. % hydrogen. In another embodiment, the protective layer has a composition comprised of 1-4 at % silicon, 20-40 at % carbon, 40-60% hydrogen, and 10-30% oxygen. Optionally, the protective layer has a composition comprised of 1-4 at % silicon, 20-40 at % carbon, 10-30% oxygen, and the balance made up of hydrogen. The protective layer may be comprised of a substantially inorganic material. The protective layer may be comprised of at least one material selected from the group consisting of: silica, alumina, aluminosilicates, diamond-like films, borosilicates, silicon nitride, aluminophosphosilicates, aluminophosphates, and/or combinations thereof. The protective layer may include a first layer of a first inorganic material and a second layer of a second inorganic material. The protective layer may include a layer of silica and a layer of alumina. The protective layer may include a plurality of fused inorganic particles. The protective layer may include a plurality of fused silica particles. The protective layer may be a layer deposited by atomic layer deposition. The protective layer may be comprised of a plurality of layers deposited by atomic layer deposition. The protective layer may be a silico-acrylic composition.

For any of the embodiments described herein, the following may also apply. Although not limited to the following, the protective layer may have a thickness in the range of about 1 to about 1000 nm. In another embodiment, the protective layer may have a thickness in the range of about 1 to about 500 nm. In another embodiment, the protective layer may have a thickness in the range of about 0.3 to about 300 nm. In another embodiment, the protective layer may have a thickness in the range of about 50 to about 200 nm. In some embodiments, the protective layer may be thicker, in the range of about 1 to about 500 microns. In other embodiments, may be in the range of about 50 to about 150 microns. The protective layer may include an organic material and an inorganic material. The protective layer may be a hybrid nanolaminate having a plurality of layers. The protective layer may include a plurality of layers of an inorganic material; and a plurality of layers of an organic material wherein the layers of organic material alternate with the layers of inorganic material. The adjacent layers of the organic material and the inorganic material may be covalently bonded layers characterized by covalent bonds that couple adjacent layers together. The total number of layers of organic polymer and layers of inorganic material in the film may be between about 100 and about 1000 layers, or between about 1000 and about 10,000 layers, or between about 10,000 layers and about 100,000 layers. Each of the layers of inorganic material may have a thickness of about 0.1 nm to about 1 nm; about 1 to about 10 nm; or about 1 nm to about 100 nm. The protective layer may be a templated nanolaminate layer with nanoparticle beads.

For any of the embodiments described herein, the following may also apply. The solar cell may be a non-silicon based solar cell. The solar cell may be an amorphous solar cell. The solar cell may be a copper-indium-selenide based alloy. The solar cell may include an absorber layer having one or more inorganic materials from the group consisting of: titania ($TiO_2$), nanocrystalline $TiO_2$, zinc oxide (ZnO), copper oxide (CuO or $Cu_2O$ or $Cu_xO_y$), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium suflide (CdS), copper sulfide ($Cu_2S$), cadmium telluride (CdTe), cadmium-tellurium selenide (CdTeSe), copper-indium selenide ($CuInSe_2$), cadmium oxide (CdOx), CuI, CuSCN, a semiconductive material, or combinations of the above. The solar cell may include an absorber layer having one or more organic materials from the group consisting of: a conjugated polymer, poly(phenylene) and derivatives thereof, poly(phenylene vinylene) and derivatives thereof (e.g., poly(2-methoxy-5-(2-ethylhexyloxy)-1,4-phenylene vinylene (MEH-PPV), poly(paraphenylene vinylene), (PPV)), PPV copolymers, poly(thiophene) and derivatives thereof (e.g., poly(3-octylthiophene-2,5,-diyl), regioregular, poly(3- octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof, 2,2'7,7'tetrakis(N, N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, a Ruthenium-based dye, a liquid iodide/triiodide electrolyte, azo-dyes having azo chromofores (—N═N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d' e'f]diisoquinoline-1,3,8,10-tetrone and pentacene, pentacene derivatives and/or pentacene precursors, an N-type ladder polymer, poly(benzimidazobenzophenanthroline ladder) (BBL), or combinations of the above. The solar cell may include an absorber layer having one or more materials from the group consisting of: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, C60 and/or other small molecules, or combinations of the above. The solar cell may include an absorber layer having one or more materials from the group consisting of: a nanostructured layer having an inorganic porous template with pores filled by an organic material (doped or undoped), a polymer/blend cell architecture, a micro-crystalline silicon cell architecture, or combinations of the above.

For any of the embodiments described herein, the following may also apply. The solar cell may be a rigid solar cell. The solar cell may be a flexible solar cell. The protective layer may fully encapsulate the solar cell. The protective layer may cover a top surface and all side surfaces of the solar cell. The protective layer may cover a top surface, a bottom surface, and all side surfaces of the solar cell. The protective layer may be a transparent colorless layer. The protective layer may be a solution deposited protective layer. The protective layer may be an ALD deposited protective layer. The protective layer may be applied to each solar cell prior to mounting the solar cell in a photovoltaic device module.

For any of the embodiments described herein, the following may also apply. The unprotected solar cell may have a lower conversion efficiency than the solar cell with the protective layer. The protective layer may have a water vapor transmission rate (WVTR) sufficiently low so that there is substantially no loss in solar cell conversion efficiency when the cell is exposed for 1000 hours at 85° C. and 85% relative humidity. The protective layer may have a WVTR such that the conversion efficiency of a cell with the protective layer has a conversion efficiency at least 25% better than an unprotected cell after both are exposed for 1000 hours at 85° C. and 85% relative humidity. The protective layer may have a WVTR such that the conversion efficiency of a cell with the protective layer has a conversion efficiency at least 50% better than an unprotected cell after both are exposed for 1000 hours at 85° C. and 85% relative humidity.

In another embodiment of the present invention, a cell string may be comprised of an encapsulated cell string, wherein the string comprises of a plurality of solar cells coupled together. The encapsulated cell string includes at least one protective layer covering the plurality of solar cells, the protective layer having a chemical composition that prevents moisture from entering each of the solar cells, wherein light passes through the protective layer to reach an absorber layer in each of the solar cells.

In yet another embodiment of the present invention, a photovoltaic device module comprising a support substrate and a plurality of individually encapsulated solar cells mounted on the support substrate. Each of the solar cells may have a protective layer, wherein the protective layer provides weatherproofing to the solar cells therein. The protective layer may also be above the solar cell and light passes through the protective layer to reach the solar cell.

In a still further embodiment of the present invention, a photovoltaic device module comprising a plurality of solar cells sandwiched between at least one top layer and at least one bottom layer. Each of the cells may have a protective layer that provides a higher level of moisture resistance than any of the layers above the cell, wherein the protective layer is above the solar cell and light passes through the protective layer to reach the solar cell.

In another embodiment of the present invention, a method comprises of providing a solar cell having an absorber layer and forming a protective layer to the solar cell using a solution-deposition process. The protective layer provides a moisture barrier that substantially prevents moisture damage to the absorber layer.

For any of the embodiments described herein, the following may also apply. The forming step may be comprised of using a substantially organic material. The forming step may be comprised of using a heat curable hardcoat material. The forming step may be comprised of using a radiation curable hardcoat material. The forming step may be comprised of using a UV curable hardcoat material. The forming step may be comprised of using a clear, non-yellowing silicone-based hardcoat material. The forming step may be comprised of using a curable polyacrylate hardcoat containing silica particles. The forming step comprises using a composition containing at least one filler material, at least one multifunctional acrylic material, and at least one higher functional acrylic material. The filler material, the multifunctional acrylic material, the higher multifunctional acrylic material, an initiator, a photoinitiator, an anaerobic gelation inhibitor, and/or a diluent may be any of the material mentioned previously herein.

For any of the embodiments described herein, the following may also apply. The forming step may be comprised of using a substantially inorganic material. Optionally, the forming step comprises of using at least one material selected from the group consisting of: silica, alumina, aluminosilicates, diamond-like films, borosilicates, silicon nitride, aluminophosphosilicates, aluminophosphates, and/or combinations thereof. The protective layer may be comprised of a first layer of a first inorganic material and a second layer of a second inorganic material. The protective layer may be comprised of a layer of silica layer and a layer of alumina. The protective layer may be comprised of a plurality of fused inorganic particles. The protective layer may be comprised of a plurality of fused silica particles. The protective layer may be comprised of a layer deposited by atomic layer deposition. The protective layer may be comprised of a plurality of layers deposited by atomic layer deposition. The protective layer may be comprised of a silico-acrylic composition. The protective layer may have a thickness in the range of about 0.3 to 300 nm. The protective layer may be comprised of an organic material and an inorganic material. The protective layer may be comprised of a hybrid nanolaminate having a plurality of layers. The forming step may be comprised of forming hybrid organic/inorganic nanolaminate. The forming step may be comprised forming a barrier waveguide film. The forming step may be comprised of using a roll-to-roll manufacturing process. Forming the protective layer may involve using a batch process. Forming the protective layer involves solution depositing a material to be processed into the protective layer on the solar cell.

For any of the embodiments described herein, the following may also apply. Forming the protective layer may be comprised of using at least one method from the group consisting of: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, aerosol spray deposition, dip coating, web coating, microgravure web coating, or combinations thereof. The protective layer may be comprised of a silico-acrylic composition containing silica, a solvent and at least one multifunctional acrylic monomer. Forming step may be comprised of forming a plurality of protective sublayers. The forming step may be comprised of forming a first layer, curing the first layer, and then applying a second layer over the first layer. The protective layer may be applied to each solar cell prior to mounting the solar cell in a photovoltaic device module. The present invention also envisions a moisture resistant solar cell formed by the method as set forth herein.

In yet another embodiment of the present invention, a method comprises of providing at least one cell string having a plurality of solar cells each having an absorber layer. The method may include forming a protective layer cover the cell string and each of the solar cells, wherein the protective layer provides a moisture barrier that prevents moisture damage to the absorber layer.

In yet another embodiment of the present invention, a method comprises of providing a plurality of solar cells each having an absorber layer. The method may include forming a protective layer covering at least one of the solar cells and placing the cells on a module support. The protective layer may provide a moisture barrier that prevents moisture damage to the absorber layer.

In another embodiment of the present invention, solar cells may be protected from the environment, particularly water, by an ultrathin film of transparent inorganic material (dielectric), which may be formed from silica-containing precursors or from atomic layer deposition of dielectric precursors, with or without the presence of small (nanoscale) silica or other dielectric particles, or by sintering such particles using rapid thermal processes which do not heat the underlying substrate. The ability to make good barriers at low cost, and especially directly on top of the cell, thereby protecting both the top and edges, and may be desirable to enable a wider choice of materials for the protective layers. In one embodiment, the method may involve the use of silica particles to provide most of the barrier, coupled with "fillers" provided from fluid phases (either liquid or gas) to connect them. Alternatively the method may involve heating the particles with RTP to fuse them while still not damaging the substrate. In yet another embodiment, atomic layer deposition may be used to place a barrier directly on the cell.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a anti-reflective film, this means that the anti-reflective film feature may or may not be present, and, thus, the description includes both structures wherein a device possesses the anti-reflective film feature and structures wherein the anti-reflective film feature is not present.

Individually Encapsulated Solar Cells

Figure 1A:
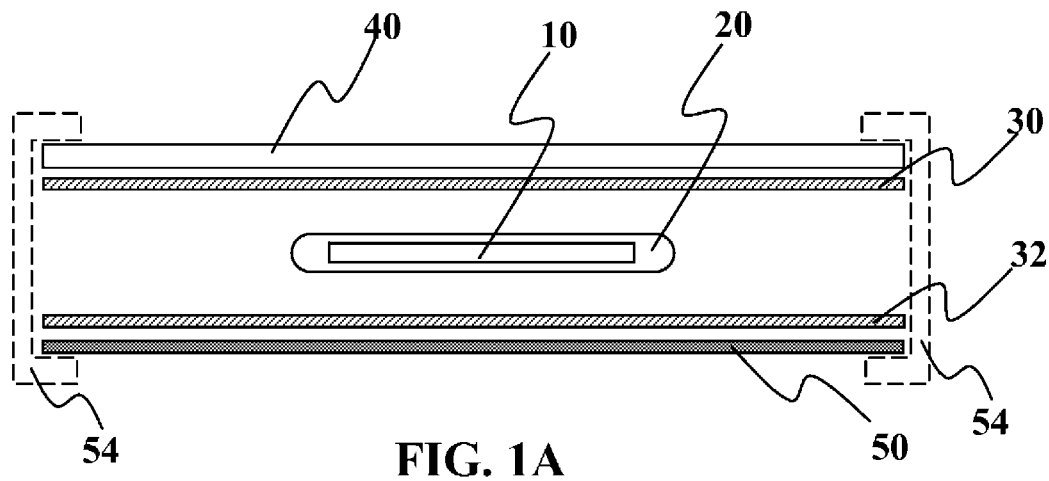
FIGS. 1A-1C show cross-sectional views of a solar cell with a protective layer according to various embodiments of the present invention.

Referring now to FIG. 1A, one embodiment of the present invention will now be described. This embodiment shows a configuration of the present invention that provides improved environmental protection for a solar cell 10. Individual encapsulation of the solar cell and/or cell string effectively addresses a variety of environmental protection issues such as, but not limited to, lateral ingress of vapor between the top and bottom protective sheets of a solar module. It may also allow for fabrication of new types of solar assemblies where module level barrier requirements and/or materials used for those barriers are relaxed since the cells and/or cell strings may be individually protected.

FIG. 1A shows an exploded view where the various layers are spaced apart for ease of illustration. The solar cell 10 is shown to be encapsulated by a protective layer 20. The protective layer 20 fully encapsulates all sides of the solar cell 10 as shown in FIG. 1A. Optionally, it should be understood that some embodiments of the present invention may involve a protective layer 20 that covers less than all sides of the solar cell 10. Preferably, the protective layer 20 covers at least one surface of the solar cell 10 to provide the desired environmental protection. In one embodiment, the protective layer 20 covers at least a top surface of the solar cell 10 that receives sunlight. In another embodiment, the protective layer 20 covers the top surface and a plurality of side surfaces of the solar cell 10 to provide the desired environmental barrier.

In the embodiment of FIG. 1A, the solar cell 10 with protective layer 20 may be mounted in a solar cell packaging that includes one or more pottant layers 30 and 32. The packaging may be sized to include one solar cell 10 or more than one solar cell 10. Optionally, the pottant layers 30 and 32 may be made of a material such as, but not limited to, a thermoplastic polyurethane, a thermosetting ethylene vinyl acetate (EVA), a thermoplastic such as polyvinyl butyral (PVB), a thermoplastic fluoropolymer such as a copolymer of tetrafluoroethylene, hexafluoropropylene and vinylidene fluoride(THV), a silicone based material, and/or a thermoplastic ionomer resin such as but not limited to DuPont Surlyn®. Although not limited to the following, the thickness of pottant layer 30 may be between 10 microns and 1000 microns, between 10 microns and 500 microns in another embodiment, and/or between 100 and 300 microns in a still further embodiment. Layer 32 may be of similar or different thickness.

The packaging shown in the embodiment of FIG. 1A may include at least one outer barrier layer 40. The outer barrier layer 40 may be a tempered glass superstrate that provides structural support and environmental protection. In other embodiments, the outer barrier layer 40 may be comprised of more flexible materials that are easier to handle and assemble in a high-throughput manner. As a nonlimiting example, the layer 40 may be comprised of a co-polymer of ethylene and tetrafluoroethylene (ETFE), or UV cured, highly cross-linked acrylic hardcoat rated at 2H, 3H, or 4H pencil scratch resistance, rated at less than 10% haze after 500 cycles of 500 g load, CS10F wheels, Taber Abrader. The ETFE may be a modified ETFE (ethylene-tetrafluoroethylene) fluoropolymer such as Tefzel®. Tefzel® combines superior mechanical toughness with chemical inertness that approaches that of Teflon® fluoropolymer resins. Tefzel® features a specific gravity of about 1.7 and high-energy radiation resistance. Most grades are rated for continuous exposure at 150° C. (302° F.), based on a 20,000-hr criterion.

The packaging shown in the embodiment of FIG. 1A may include at least one backside support layer 50. The backside support layer 50 may be comprised of a variety of materials. In one nonlimiting example, layer 50 may be selected from the following example of back sheets: Tedlar®-polyester-Tedlar® (TPT), Tedlar®-polyester (TP), Tedlar®-aluminum-polyester (TAP), Tedlar®-aluminum-polyester-Tedlar® (TAPT), and/or Tedlar®-aluminum-polyester-EVA (TAPE). Tedlar® comprises of polyvinyl fluoride (PVF) and is available from Dupont. These conventional back sheets also contain adhesive tie layers and adhesion-promoting surface treatments that are proprietary to the back sheet vendors. Conventional back sheets are available from Isovolta of Austria and Madico of USA. Layer 50 may optionally be selected from the following examples of unconventional back sheets: aluminum sheet; galvanized steel; Galvalume® 55% aluminum-zinc alloy coated sheet steel; conversion-coated steel such as chromate-based, phosphate-based, or similar corrosion-resistant coated sheet steel; plasticized or unplasticized polyvinylchloride (PVC) formulations; aliphatic ether or aliphatic ester or aromatic ether or aromatic ester thermoplastic polyurethanes; ethylene-propylene-diene (EPDM) rubber sheet; thermoplastic polyolefin (TPO) sheet, polypropylene sheet, polyethylene sheet, polycarbonate sheet, acrylic sheet, and/or single or multiple combinations thereof.

It should be understood that edge sealing material 54 (shown in phantom) may optionally be used to prevent moisture penetration along the sides of the various layers 30, 32, 40, and 50. The edge sealing material 54 may be selected from the group consisting of: butyl rubber tape, butyl rubber tape with desiccant powder, epoxy, flexiblized epoxy, epoxy with desiccant, flexiblized epoxy with desiccant, or combinations thereof.

Figure 1B:
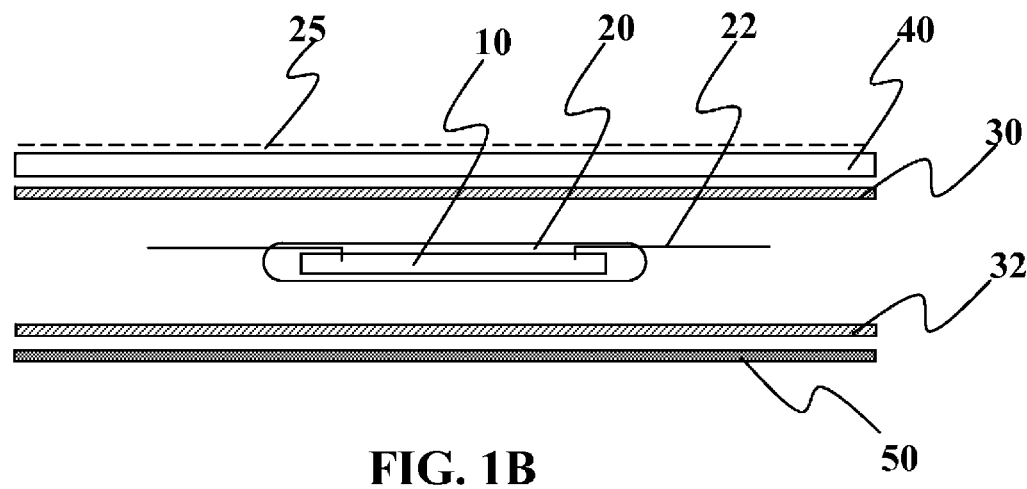

Referring now to FIG. 1B, a solar cell 10 is shown with electrical leads 22. The electrical leads 22 may extend outward from the individually encapsulated solar cell 10 to connect to another cell, to a cell string, or to another solar cell module. The leads 22 may be placed before and/or during and/or after the formation of the protective layer 20. Optionally, the leads 22 may be added after the protective layer 20 is formed. In still other embodiments, the leads 22 may also be coated with a material similar to that used for the protective layer 20. FIG. 1B also shows that a layer 25 of material may such as but not limited to silica and/or alumina may be coated on one side of the layer 40. It should be understood that in some embodiments, the backside support 50 may be comprised of a roofing membrane or some other housing construction material. This may facilitate integration of photovoltaic capability with such materials.

Figure 1C:
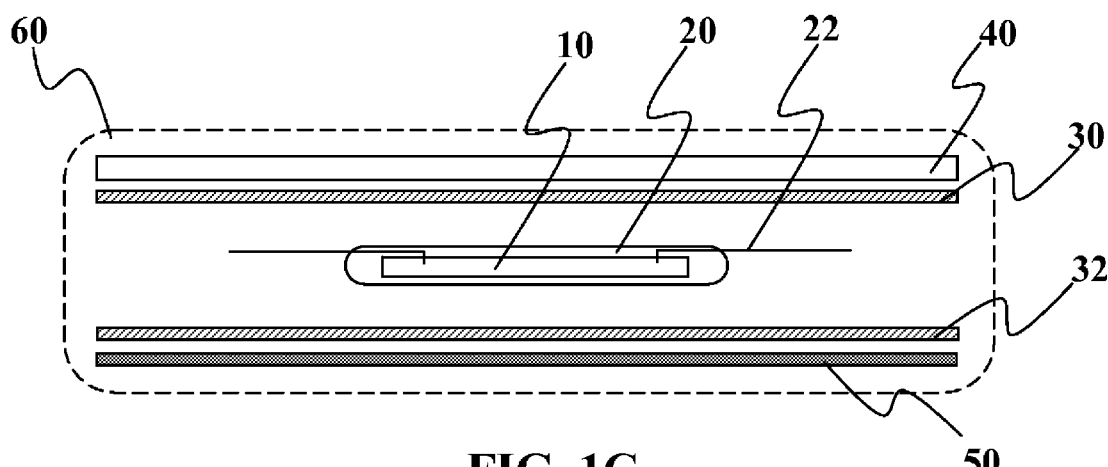

Referring now to FIG. 1C, it should be understood that optionally the individually encapsulated solar cell 10, pottant layers 30 and 32, outer barrier layer 40 and backside support 50 may be covered with a protective barrier 60 (shown in phantom). The material used for the protective barrier 60 may be similar to that used for the protective layer 20. This protective barrier 60 may be coated after the layers and cells are coupled together. Other embodiments may be configured so that at least some or all of the layers and components are coated with barrier 60 prior to full assembly.

Substantially Organic Protective Layer

Figure 2:
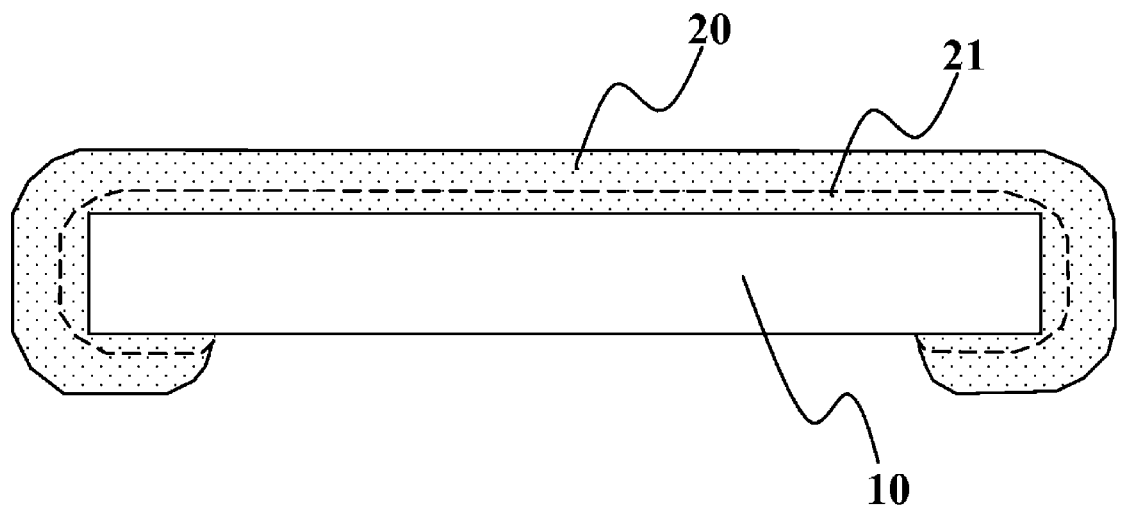
FIG. 2 shows a solar cell with a substantially organic protective layer according to one embodiment of the present invention.

Referring now to FIG. 2, it should be understood that a variety of materials may be adapted for use as the protective layer 20. In one embodiment of the present invention, a substantially organic material may be adaptable for use as the protective layer 20. Specifically, organically-based hardcoat materials may be suitable for use with a solar cell 10. As seen in FIG. 2 showing protective layer 20 and layer 21 (shown in phantom), more than one layer of the hardcoat may be applied to address any defects that may be found if only one layer of the hardcoat is applied. Hardcoats that may be suitable include acrylic hardcoats, acrylic silicone hardcoats, silicone hardcoats, silica hardcoats, or the like. These hardcoats may be hardcoats that are cured by ultraviolet techniques, electron-beam irradiation techniques, other radiation techniques, thermal heating techniques, or other curing techniques. Alternatively, hardcoats may also be in the form of pre-formed layers that are adhered to the target surface by other techniques.

Figure 3:
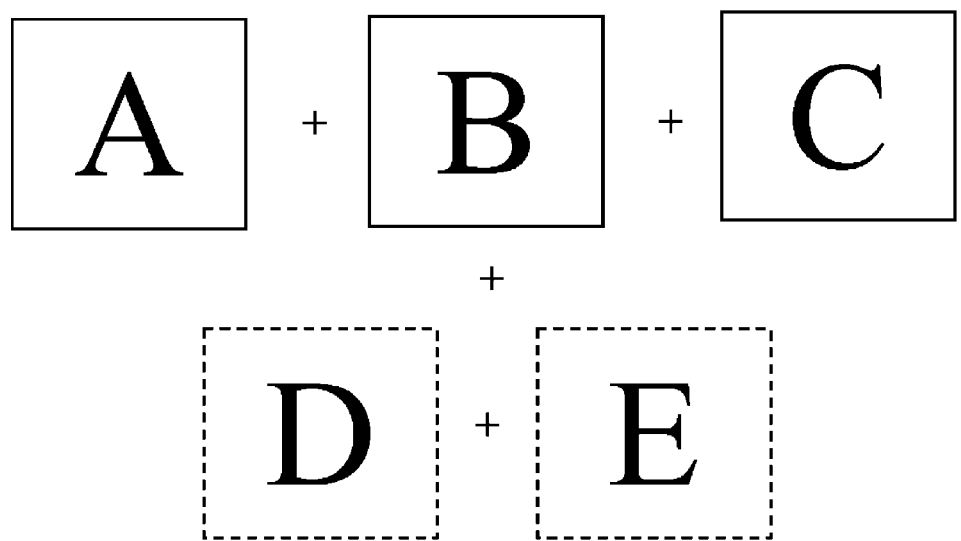
FIG. 3 is a schematic showing various components in an organic-based protective layer according to embodiments of the present invention.

Referring now to FIG. 3, one embodiment of the present invention may use a curable, substantially organic hardcoat protective layer coupled to the solar cell 10. By way of non-limiting example, the composition of suitable hardcoat protective layers will be described herein. The curable hardcoat protective layer may be comprised of an acrylic composition containing multiple Components A, B, and/or C. As seen in FIG. 3, the acyrlic composition may optionally include other components such as but not limited to Components D and/or E in addition to the Components A, B, and/or C.

Component (A) of such an acrylic composition may be comprised of a multifunctional (meth)acrylate oligomer and/or a multifunctional (meth)acrylate monomer. Although not limited to the following, these oligomers and/or monomers are preferably photopolymerizable materials. In one embodiment, Component (A) may include at least one acrylate or methacrylate monomer which contains two or more acrylate or methacrylate functional groups. Some preferred multifunctional acrylate monomers useable as Component (A) include: diacrylates, such as 1,6-hexanediol diacrylate, 1,4-butanediol diacrylate, ethylene glycol diacrylate, diethylene glycol diacrylate, tetraethylene glycol diacrylate, tripropylene glycol diacrylate, neopentyl glycol diacrylate, 1,4-butanediol dimethacrylate, poly(butanediol) diacrylate, tetraethylene glycol dimethacrylate, 1,3-butylene glycol diacrylate, triethylene glycol diacrylate, triisopropylene glycol diacrylate, polyethylene glycol diacrylate, and bisphenol A dimethacrylate; triacrylates such as trimethylolpropane triacrylate, trimethylolpropane trimethacrylate, pentaerythritol monohydroxy triacrylate, and trimethylolpropane triethoxy triacrylate; tetraacrylates, such as pentaerythritol tetraacrylate and di-trimethylolpropane tetraacrylate; and pentaacrylates, such as dipentaerythritol; or (monohydroxy) pentaacrylate. These multifunctional acrylate monomers are commercially available from Aldrich Chemical Company, Inc., Milwaukee, Wis.

The second Component (B) may include silica for example in the form of a colloidal dispersion. Useful in the present invention are dispersions of silica ($SiO_2$) particles suspended in water and/or in an organic solvent mixture. The dispersion of colloidal silica comprises 1 percent to 70 percent, optionally 55 percent to 70 percent, of the coating composition. Colloidal silica is available in both acidic and basic form. Either form may be utilized. Examples of useful colloidal silica include: Nalco 1034A colloidal silica, Nalco 1129 colloidal silica, Nalco 2327 colloidal silica, Nalco 2326 colloidal silica and Nalco 1140 colloidal silica, which can be obtained from Nalco Chemical Company, Naperville, Ill.

It should be understood that the silica or other filler particles may be present in Component (B) as nanoscale particles. The particles may be of spherical, planar, oblong, flake, other shapes, or combinations of the foregoing shapes. When measured along their longest dimension, they may be at a size less than about 1 micron. Optionally, they may be less than about 500 nm. In other embodiments, they may be less than 250 nm. In still other embodiments, the silica particles may be less than about 100 nm. The silica particles may have an average particle diameter of about 5 to about 1000 nm, between about 10 to about 50 nm in another embodiment. Average particle size can be measured using transmission electron microscopy to count the number of particles of a given diameter.

Optionally, the second Component (B) may be comprised of a siloxane material, with or without silica particles. In one embodiment, the Component (B) may be an organopolysiloxane comprising a silyl acrylate and aqueous colloidal silica. The silyl acrylate may be v-methacryloxypropyltrimethoxysilane. This provides a rapidly UV curable organopolysiloxane hardcoat composition. Optionally, the Component (B) may be acryloxy or glycidoxy functional silanes or mixtures thereof. Specific examples of acryloxy-functional silanes include: 3-methacryloxypropyltrimethoxysilane, 3-acryloxypropyltrimethoxysilane, 2-methacryloxyethyltrimethoxysilane, 2-acryloxyethyltrimethoxysilane, 3-methacryloxypropyltriethoxysilane, 3-acryloxypropyltriethoxysilane, 2-methacryloxyethyltriethoxysilane, and/or 2-acryloxyethyltriethoxysilane. Specific examples of useful glycidoxy-functional silanes include the following: 3-glycidoxypropyltrimethoxysilane, 2-glycidoxyethyltrimethoxysilane, 3-glycidoxypropyltriethoxysilane, and/or 2-glycidoxyethyltriethoxysilane. The foregoing materials may be used to functionalize the silica particles. The functionalized particles may bond intimately and isotropically with an organic matrix defined by the other components. Although not limited to the following, the silica particles are typically functionalized by adding a silylacrylate to aqueous colloidal silica.

The third Component (C) may be a material useful for initiating and/or facilitating curing of the composition. For example, the acrylic composition may be crosslinked by a variety of methods such as but not limited to ultraviolet light, heat, or electron beam radiation exposure. If ultraviolet light is used to crosslink the coating composition, inclusion of a photoinitiator into the coating composition is desired. The photoinitiator, when one is employed, may comprise up to 10 percent of the composition, 0.5 to 3 percent in another embodiment. There are no special restrictions on the photoinitiators as long as they can generate radicals by the absorption of optical energy. By way of nonlimiting example, suitable photoinitiators include 2-hydroxy-2-methyl-1-phenyl-propan-1-one (Darocur® 1173), sold by EM Industries, Inc., Hawthorne, N.Y., and 2,2-dimethoxy-2-phenyl-acetyl-phenone (Irgacure® 651), sold by Ciba-Geigy Corporation, Hawthorne, N.Y. In addition, oxygen inhibitors may also be used in conjunction with the photoinitiators. A preferred oxygen inhibitor is 2-ethylhexyl-para-dimethylaminobenzoate, available as Uvatone® 8303, from The Upjohn Company, North Haven, Conn. Of course, compositions using other techniques for curing may include other types of initiators.

A fourth Component (D) may optionally be included in some embodiments of the present composition. Component (D) may be selected from the materials listed for Components A, B, or C. As a nonlimiting example, the Component D may be another multifunctional (meth)acrylate oligomer and/or a multifunctional (meth)acrylate monomer selected from the group presented for Component A. In such an embodiment, both a diacrylate and a higher functional acrylate are used. Such an embodiment of the composition may include at least two materials selected from the list comprised of: diacrylates, such as 1,6-hexanediol diacrylate, 1,4-butanediol diacrylate, ethylene glycol diacrylate, diethylene glycol diacrylate, tetraethylene glycol diacrylate, tripropylene glycol diacrylate, neopentyl glycol diacrylate, 1,4-butanediol dimethacrylate, poly(butanediol) diacrylate, tetraethylene glycol dimethacrylate, 1,3-butylene glycol diacrylate, triethylene glycol diacrylate, triisopropylene glycol diacrylate, polyethylene glycol diacrylate, and bisphenol; dimethacrylate; triacrylates such as trimethylolpropane triacrylate, trimethylolpropane trimethacrylate, pentaerythritol monohydroxy triacrylate, and trimethylolpropane triethoxy triacrylate; tetraacrylates, such as pentaerythritol tetraacrylate and di-trimethylolpropane tetraacrylate; and pentaacrylates, such as dipentaerythritol; and/or (monohydroxy) pentaacrylate.

A fifth Component (E) may optionally be included in some embodiments of the present composition. The fifth Component (E) may serve a variety of different purposes. In one embodiment, the fifth Component (E) may be a diluent such as an organic solvent and or water miscible organic solvent. The compositions of this invention may optionally include a diluent selected from the group consisting of isopropanol, t-butanol, n-propanol, n-butanol, methanol, ethanol, ethylene glycol n-butyl ether, and mixtures thereof. Other diluents may also be used as long as a diluent selected from the aforementioned group may be present in an amount of at least 17 percent, based on the total amount of diluents in the composition. Other embodiments may have lower concentrations.

Optionally, the fifth Component (E) may be an anaerobic gelation inhibitor such as but not limited to 2,2,6,6-tetramethylpiperidinyloxy, 4-hydroxy-2,2,6,6-tetramethylpiperidinyloxy, bis(4-hydroxy-2,2,6,6-tetramethylpiperidinyloxy sebacate diradical, 2,2-diphenyl-1-picrylhydrazyl, 1,3,5-triphenylverdazyl, 1-nitroso-2-naphthol, or a nitrone. Such an inhibitor may be particularly useful in a solventless composition. In alternative embodiments, methylhydroquinone, galvinoxyl, 4-hydroxy-2,2,6,6-tetramethylpiperidinyloxy, N-t-butyl-α-phenyl nitrone, and/or 2,2-diphenyl-1-picrylhydrazyl hydrate (DPPH) may be used as gelation inhibitors.

Still other embodiments of the present invention may use a Component (E) comprised of a hindered amine derivative. One such derivative is available from Ciba-Geigy Corporation under the trade name Tinuvin123. The hindered amine light stabilizers and UV absorbers may be useful as additives to the present coating composition. Hindered amine light stabilizers and UV absorbers act to diminish the harmful effects of UV radiation on the final cured product and thereby enhance the weatherability, or resistance to cracking, yellowing and delamination of the coating. A preferred hindered amine light stabilizer is bis(1,2,2,6,6-pentamethyl-4-piperidinyl)[3,5-bis(1,1-dimethylethyl-4-hydro xyphenyl)methyl]butylpropanedioate, available as Tinuvin® 144, from CIBA-GEIGY Corporation, Hawthorne, N.Y. A preferred UV absorber is 2,2'4,4'-tetrahydroxybenzophenone, available as Uvinul® D-50, from BASF Wyandotte Inc., Parsippany, N.J.

It should be understood that the ratio of components in the composition may vary. In one embodiment, the composition may have components in the following ranges: Component A 30-60%, Component B 10-30%, Component $C_{5-10}$%, and Component D 10-30%. In another embodiment, the composition may have components in the following ranges: Component A 30-60%, Component B 10-30%, Component C 5-10%, Component D 10-30%, and Component E 10-30%.

In one embodiment, the hardcoat composition includes between 2 at. % silicon, 32 at. % carbon, 48 at % hydrogen, and 17 at % oxygen. In another embodiment, the composition may have 1-4 at % silicon, 20-40 at % carbon, 10-30 at % oxygen, and the balance made up by hydrogen. In some embodiments, the amount of hydrogen may be in the range of about 40-60 at %.

Although not limited to the following, in some embodiments, the protective layer from the hardcoat may be in the range of about 1 to about 500 microns in thickness. Some may have thickness less than 1 micron. In other embodiments, the protective layer may be in the range of about 50 to about 300 microns. In other embodiments, the protective layer may be in the range of about 50 to about 150 microns. In other embodiments, the protective layer may be in the range of about 75 to about 100 microns. Of course, it should be understood that more than one protective layer may optionally be applied to each cell. Some embodiments may further include an anti-reflective layer above the protective layer. In some embodiments, the protective layer may have anti-reflective qualities.

By way of nonlimiting example, some commercially available hardcoats adaptable for use with the present invention are listed blow. A number of heat curable or UV curable silane prepolymer compositions are commercially available from Wacker Silicones Corporation of Adrian, Mich.; Tego Chemie Service USA of Hopewell, Va.; and GE Silicones of Waterford N.Y. As nonlimiting examples, heat curable silane prepolymer compositions are available from GE Silicones under the trade names SCH 1200, AS 4000, LHC 100 and SHC 1010. Another heat curable silicone hard coat is available from Nippon Dacro Shamrock Co., Ltd. under the trade name SolGard. These silane prepolymers may be applied by a variety of methods including but not limited to dip, flow, spray, electrostatic or spin coating. Substrates treated with these silane prepolymers may be allowed to dry at room temperature until tack free (15 to 20 minutes). Depending upon the specific silane prepolymer employed, the coated substrates are then heated to a temperature greater than about 30° C. in order to cure the prepolymer and form the polyorgano-siloxane clear coat layer.

A variety of commercially available UV curable materials may also be used with the present invention. Some suitable UV curable silane prepolymer compositions are available from Shin-Etsu Chemical Co., Ltd. under the trade names X-12, X-12-2206, X-12-2400, and X-12-2450; from Nippon Kayaku Co., Ltd. under the trade name Kayanova FOP; from Wacker Silicones under the trade name Wacker F series and Wacker F-737; from GE Silicones under the trade name UVHC series; from To a Gosei Chemical Industry Co., Ltd. under the trade names Aronix UV, Aronix UV-3033 and Aronix UV-3700; from Shin Nakamura Chemical Company and To a Gosei Chemical Industry Co., a mixture of compounds under the trade names NK-Oglio-U4H and Aronix TO-1429; and from Tego Chemie Service (a division of Degussa Corporation) under the trade names Tego Silicone Acrylate 704, Tego Silicone Acrylate 705, Tego Silicone Acrylate 706, Tego Silicone Acrylate 707, Tego Silicone Acrylate 725, and Tego Silicone Acrylate 726. Other suitable protective materials may be available from Rohm & Haas Company under the trade name LS123; from the Stanley Electric Co. Ltd. under the trade names SH2, SH41, and SHSO; from Mitsubishi Rayon Co. Ltd. under the trade names Acryking, Acryking PH350, and Acryking PH511; from Fujikura Kasi Co. Ltd. under the trade names Fujihard 2500 and Fujihard 2551; and Red Spot Pain & Varnish Co. Inc. under the trade names UVT-200.

Optionally, still other types of hardcoat materials may be also be adapted for use with the present invention. Dai Nippon Printing Co. Ltd. (DNP) in conjunction with Fuji Photo Film Co., Ltd. (FujiFilm) have developed various hardcoat films suitable for use with the present invention. InteliCoat Technologies provides a flexible, abrasion-resistant optically clear hardcoat films available under the trade name StratFX. 3M provides hardcoat films under the trade name Vikuiti™. Targray supplies a UV-curable transparent hardcoat (Hardcoat #71) which provides a very hard scratch-resistant layer of 3-5 µm with excellent optical properties. Lintec Corporation has developed a polycarbonate film under the trade name Opteria that combines a hard coat and pressure-sensitive adhesive. Details of such a hardcoat are found in US Patent Publication 20040081831 fully incorporated herein by reference. Teijin Chemical also provides a polycarbonate hardcoat film under the trade name PureAce. TDK Corporation provides a clear polymer coating under the trade name Durabis. Details of such a hardcoat may be found in US Patent Publications 20050095432 and 20050123741, both fully incorporated herein by reference. Vitrinite® available from Metroline Industries, Inc. may also possess the desired protective properties.

Substantially Inorganic Protective Layer

Figure 4:
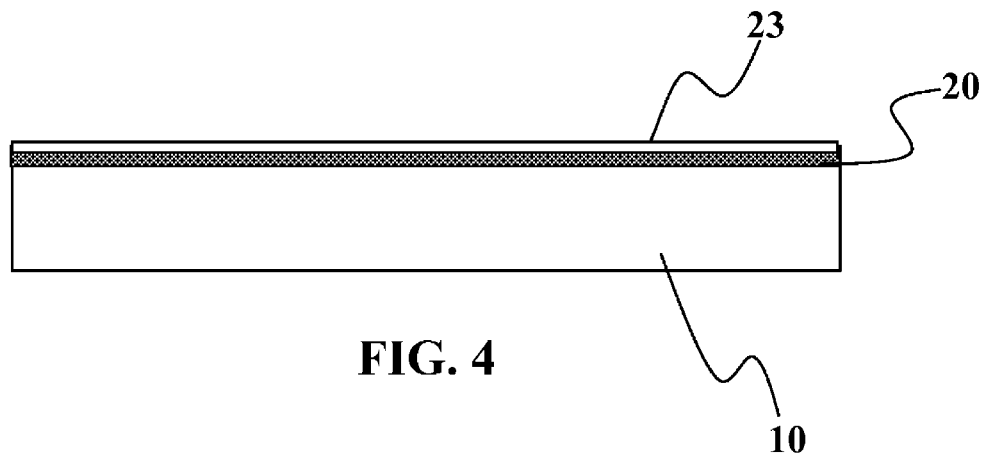
FIG. 4 shows a solar cell with a substantially inorganic protective layer according to one embodiment of the present invention.

Referring now to FIG. 4, it should be understood that a variety of inorganic or substantially inorganic materials may also be suitable for use as the protective layer 20 shown in FIG. 1, in addition to or in place of, the substantially organic protective layers. In one embodiment as shown in FIG. 4, one material suitable for use as a protective layer is alumina. Other inorganic materials suitable for coating the cell 10 include, but are not limited to, silica, aluminosilicates, diamond-like films, borosilicates, silicon nitride, aluminophosphosilicates, aluminophosphates, and/or combinations thereof. Other inorganic materials may also be suitable if they can provide a sufficient moisture barrier and are sufficiently transparent to allow light to reach the absorber layer of the solar cell 10. By way of nonlimiting example, other suitable materials may include Niobium oxide ($Nb_2O_5$), Niobium nitride (NbN), Zirconium Oxide ($ZrO_2$), Zirconium Nitride (ZrN), Hafnium Oxide ($HfO_2$), Hafnium nitride (HfN), Zinc oxide (ZnO), Yttrium oxide ($Y_2O_3$), Cerium Oxide ($CeO_2$), Scandium Oxide ($Sc_2O_3$), Erbium oxide ($Er_2O_3$), Tantalum oxide ($Ta_2O_5$), Tantalum nitride (TaNx), Vanadium oxide ($V_2O_5$), Indium Oxide ($In_2O_3$), Aluminum nitride (AlN), Titanium Nitride (TiN), Molybdenum nitride (MoN), Gallium nitride (GaN), Lanthanum oxide ($La_2O_3$), Zinc Sulfide (ZnS), Tin oxide ($SnO_2$), strontium sulfide (SrS), calcium sulfide (CaS), lead sulfide (PbS), and/or combinations thereof. Of course, the protective layer 20 may be formed on the cells, the cell strings, or the solar cell module.

As seen in FIG. 4, a protective layer 20 of alumina can been established via a variety of processes including but not limited to atomic layer deposition (ALD). Extraordinarily complete kinetic barrier properties may be found when a plurality of atomic layers of low-defect ALD deposited material is used. Some embodiments may have 50 or more layers. Some embodiments may have 80 or more layers. Some embodiments may have 100 or more layers. Some embodiments may have 1000 or more layers. The total thickness of the resulting ALD barrier may be in the range of about 100 to about 1000 angstroms. Some embodiments may have ranges between 200-800 angstroms. Some embodiments may have ranges between 200-500 angstroms. Other embodiments may have a range of 250-350 angstroms.

It should be understood that ALD process typically comprises of a series of half-reactions to deposit the monolayers. There are generally two types of reactions to form a metal oxide layer via the ALD process. In a first type of ALD reaction, the process comprises of the repeated application of organometallic precursor material and water to the target surface. In a second type of ALD reaction, the process comprises of the repeated application of a metal halide precursor material and water to the target surface.

As an example of the first type of reaction, depositing a layer of alumina over the solar cell 10 comprises of alternating exposure of the cell 10 to $Al(CH_3)_3$ and $H_2O$ to form the ALD monolayers. Reactions using $Al(CH_3)_3$ are preferably conducted in chamber(s) with sufficient structural strength to withstand any highly exothermic or rapid combustion reactions associated with the material. The ALD half reactions may be summarized as:

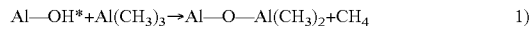

Al—OH*+Al(CH₃)₃→Al—O—Al(CH₃)₂+CH₄    1)

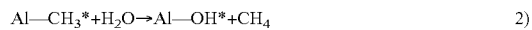

Al—CH₃*+H₂O→Al—OH*+CH₄    2)

The asterisk indicates which material is on the substrate. It is also understood that the second methyl —$CH_3$ group in the first half-reaction product is removed in a similar reaction step to that shown in the second half-reaction.

In another nonlimiting example of the first reaction type, tris(diethylamino) aluminum $Al(NEt_2)_3$ and/or tris(di-isopropylamino)aluminum may be used as precursors with water as a co-reactant in an ALD deposition process. Details can be found in copending U.S. Patent Publication US20050003662 to Jurisch et al., fully incorporated herein by reference for all purposes.

As an example of the second type of reaction, layers of silica may deposited over the cell 10 by alternating exposure of the cell 10 to $SiCl_4$ and $H_2O$ to form the ALD monolayers. The ALD half reactions may be comprised of:

SiOH*+SiCl₄→SiO—Si—Cl₃*+HCl    1)

Si—Cl*+H₂O→Si—OH*+HCl    2)

In another nonlimiting example, layers of titania may deposited over the cell 10 by alternating exposure of the cell 10 to $TiCl_4$ and $H_2O$ to from the ALD monolayers.

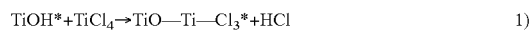

TiOH*+TiCl₄→TiO—Ti—Cl₃*+HCl    1)

) Ti—Cl*+H₂O→Ti—OH*+HCl    2)

Details on various other ALD half reactions such as from halnium oxide can be found with reference to Widjaja, Y. Musgrave, C. B. "Atomic layer deposition of hafnium oxide: A detailed reaction mechanism from first principles" Journal of Chemical Physics, 2002, VOL 117; PART 5, pages 1931-1934, fully incorporated herein by reference for all purposes. Methods of forming hafnium oxide, zirconium oxide and nanolaminates of hafnium oxide and zirconium oxide can be found in U.S. Pat. No. 6,420,279 to Ono, et al., fully incorporated herein by reference for all purposes.

Various modifications may be made to decrease the processing temperature associated with typical ALD processes. Some of these typical ALD processes may operate at temperatures >100-300° C. The use of materials such as but not limited to a Lewis base catalyst may allow for deposition of ALD monolayers at significantly reduced temperatures. As one nonlimiting example, a catalyst such as pyridine or ammonia may be used to reduce the processing temperature. In some embodiments, the ALD processing temperature can be lowered to as low as room temperature. Details on techniques for lowering ALD processing temperature can be found in J. W. Klaus and S. M. George, "Atomic Layer Deposition of $SiO_2$ at Room Temperature Using $NH_3$-Catalyzed Sequential Surface Reactions", Surf. Sci. 447, 81-90 (2000). Details on applying ALD alumina over polymers can be found in J. D. Ferguson, A. W. Weimer, S. M. George, "Atomic Layer Deposition of Al2O3 Films on Polyethylene Particles" Chem. Mater. 16, 5602-5609 (2004). Details on techniques for using ALD layers as a wear-resistant coating can be found in T. M. Mayer, J. W. Elam, S. M. George and P. G. Kotula, "Atomic Layer Deposition of Wear-Resistant Coatings for Micromechanical Devices", Appl. Phys. Lett. 82, 2883-2885 (2003). All of the aforementioned publications are fully incorporated herein by reference for all purposes.

Furthermore, different types of ALD techniques may be used to achieve high throughput processing. By way of nonlimiting example, this may involve batch ALD processing of a plurality of solar cells simultaneously. Alternatively, high throughput ALD processing using a coiled support may be used to process a plurality of cells on an elongated substrate using a technique detailed in U.S. patent application Ser. No. 10/782,545 filed Feb. 19, 2004 and fully incorporated herein by reference for all purposes.

M. D. Groner, et al., in the journal Applied Physics Letters, vol. 88, p. 051907 (2006), demonstrated that the water vapor permeability of a foil of poly(ethylene naphthalate), or PEN, is reduced at least 10,000× by a layer of 10 nm of alumina deposited by ALD. The final value of $\sim 10^{-3}$ g/m$^2$/day is sufficiently low to be a valuable barrier for the protection of CIGS solar cells. The deposition temperature used in these experiments was 125° C. Even lower temperatures appear useful. The protective layer 20 provides the hermetic seal that eliminates the edge permeation problem.

In another embodiment of the present invention, the protective layer 20 has also been shown to work with a combination of alumina ALD followed by silica ALD or vice versa. This combination will have slightly enhanced performance because silica is even less reactive with water than alumina. Combinations of inorganic materials may also be possible such as but not limited to, hafnium oxide/tantalum oxide, titanium oxide/tantalum oxide, titania/alumina, zinc sulfide/alumina, ATO, AlTiO, and/or combinations thereof. Nanolaminates may also be formed using the forgoing material combinations. U.S. Pat. No. 6,420,279 to Ono, et al., fully incorporated herein by reference for all purposes also teaches formation of such nanolaminates. Optionally, some embodiments may include any ALD deposited layer followed by coating via solution deposited layer such as but not limited to hardcoat material as previously discussed. Of course, some embodiments may place a hardcoat material over the target surface followed by coverage by any of foregoing ALD deposited layers. The layer of alumina may be in the range of about 100 to about 1000 angstroms. Some embodiments may have ranges between 200-500 angstroms. Other embodiments may have a range of 250-350 angstroms. In addition to that, the layer of silica used with the alumina may be in the range of about 100 to about 1000 angstroms. Some embodiments may have ranges between 200-500 angstroms. Other embodiments may have a range of 250-350 angstroms.

In some embodiments of the present invention, it may be advantageous if the protective layer 20 is deposited after the cells have been connected in a series string, so that the only protrusion from the coating is comprised of the tabbing metal which is used to connect the string to the next string in the module.

A further advantage of the protective layer 20 is that it protects the surface of the cell against mechanical damage during handling as it is being put into a module. Even though it is very thin, a layer of alumina is quite hard, and is therefore a more effective protective layer than the TCO.

A still further embodiment of the present invention may add a thin capping layer 23 above the protective layer 20 to protect the underlying layers. The capping layer 23 may be between about 5 to about 10 angstroms in thickness. In other embodiments, the capping layers may be between 1 to about 20 angstroms in thickness. The capping layer 23 may have a material selected from one or more of the following: Niobium oxide ($Nb_2O_5$), Niobium nitride (NbN), Zirconium Oxide ($ZrO_2$), Zirconium Nitride (ZrN), Hafnium Oxide ($HfO_2$), Hafnium nitride (HfN), Zinc oxide (ZnO), Yttrium oxide ($Y_2O_3$), Cerium Oxide ($CeO_2$), Scandium Oxide ($Sc_2O_3$), Erbium oxide ($Er_2O_3$), Tantalum oxide ($Ta_2O_5$), Tantalum nitride (TaNx), Vanadium oxide ($V_2O_5$), Indium Oxide ($In_2O_3$), Aluminum nitride (AlN), Titanium Nitride (TiN), Molybdenum nitride (MoN), Gallium nitride (GaN), Lanthanum oxide ($La_2O_3$), Zinc Sulfide (ZnS), Tin oxide ($SnO_2$), strontium sulfide (SrS), calcium sulfide (CaS), and lead sulfide (PbS).

The described barrier layer also has desirable dielectric properties. Because of the high quality (density, uniformity and low polarity) of the material, its insulating qualities are equivalent to much thicker layers of encapsulating polymers such as EVA (whose resistivity is ~1000× lower than the best polymer insulators). Thus, the amount of encapsulant polymer can be reduced, saving cost, and the cells can be placed closer together, thereby increasing the efficiency of the module.

Figure 5A:
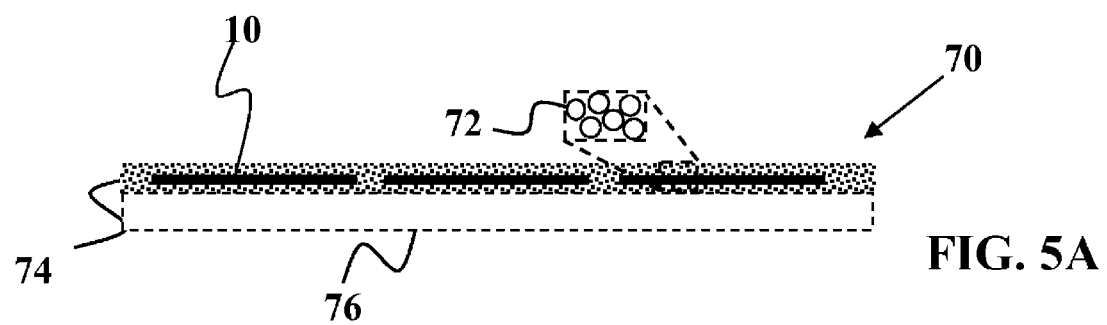
FIGS. 5A and 5B show the fusing of inorganic particles to form a protective layer according to one embodiment of the present invention.
Figure 5B:

Referring now to FIGS. 5A and 5B, the present invention also discloses other, non-ALD methods of providing a substantially inorganic protective layer for flexible solar cells which has good barrier properties, mechanical toughness, and stability under UV irradiation. It should be understood that various other vacuum based processes such as but not limited to cyclical layer deposition, chemical vapor deposition (CVD), physical vapor deposition (PVD), plasma enhanced chemical vapor deposition (PECVD), and other deposition techniques may be used. Other non-vacuum based deposition techniques may also be adapted for use with the present invention.

In one embodiment of a non-vacuum deposition technique as seen in FIG. 5A, an unfused barrier layer 70 is comprised of silica particles 72 (shown more clearly in the enlarged portion of FIG. 5A), which may have nanometer scale dimensions, which are fused to form a good barrier. The underlying photovoltaic cells 74 may be stand alone device or devices supported on a support layer 76 (shown in phantom). It should be understood that for any of the embodiments herein, the cells 10 may be individually encapsulated or they may be mounted on a support and then encapsulated. If the particles 72 are spherical (or approximately so), and of submicron diameter, then they touch in many places, and even a small degree of fusing (not enough to eliminate all free volume) is sufficient to create a long, tortuous path for diffusing gas molecules.

Referring to FIG. 5B, the fusing of particles 72 results in the fused barrier film 80, and this may be accomplished by several methods. One method is by application of a short, intense pulse of heat (from a laser, for example), which is short enough so that heating and cooling take place on a microsecond or shorter time scale, and this time is insufficient for chemical damage to occur to an underlying layer. Such short-pulse thermal treatment has been applied to the recrystallization of silicon on polymer films, for example, as described in U.S. Pat. No. 5,346,850 issued to J. L. Kaschmitter, et al.

A second method is by the decomposition of a soluble precursor of silica (or a similar inorganic dielectric material) into which the particles have been dispersed. Spin on glass (SOG) precursors such as dimethylsiloxane may be used, for example. With a high particle loading of the dispersion, a coating can be made in which the particles occupy most of the volume, while the fluid occupies the interstitial volume and a thin coating on the particles. When this film is heated to decompose the SOG precursor, the space not originally occupied by solid silica spheres or other particles is now occupied by SOG which is of sufficiently low permeability to severely impede the diffusion of vapor molecules through the small cross-section paths in between particles.

A third method is by the decomposition of vapor phase precursors, especially in a high-density plasma such as described by J. R. Sheats, et al., in U.S. Pat. No. 6,146,225, issued Nov. 14, 2000, entitled "Transparent, flexible permeability barrier for organic electroluminescent devices". Such plasmas enable the deposition of dense dielectric films at low temperatures. When combined with a pre-existing layer of silica (or other dielectric) nanoparticles, the plasma-deposited film can fill in the interstitial spaces with a dense and highly impermeable material. The combination of the two materials results in a much faster and more economical process since the majority of the volume is occupied by the particles and this volume does not have to be deposited by the relatively slow and expensive plasma process.

In addition to the methods of solution precursor deposition and plasma processing previously described, a further preferred embodiment makes use of atmospheric plasma chemical vapor deposition, using equipment that is sold for example by Surfx Technologies LLC, 3617 Hayden Avenue, Culver City, Calif. 90232. Silica films can be deposited by this technique over large areas at substantially higher rates than with conventional plasma enhanced chemical vapor deposition (PECVD), with lower cost due to the absence of need for vacuum.

Organic/Inorganic Hybrid Protective Layer

Figure 6:
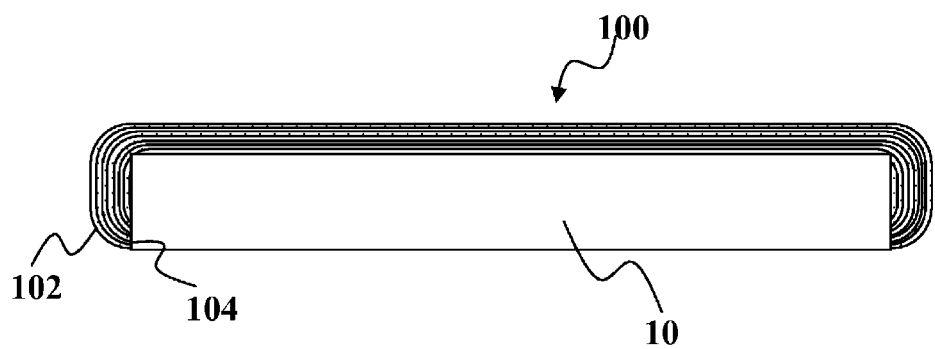
FIG. 6 shows a solar cell with a hybrid organic/inorganic protective layer according to one embodiment of the present invention.
Figure 7:
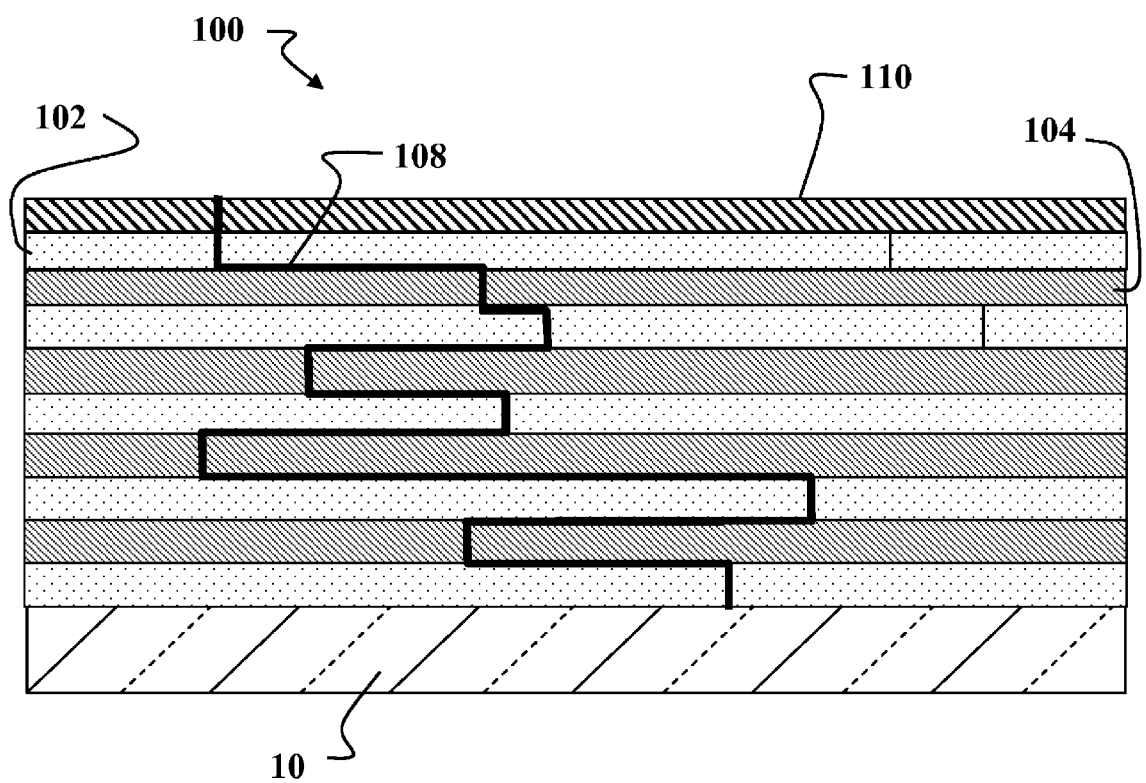
FIG. 7 shows a close-up cross-sectional view of the hybrid organic/inorganic protective layer according to one embodiment of the present invention.

Referring now to FIGS. 6 and 7, it should be understood that a still further type of material may be used for the protective layer 20 of FIG. 1. In one embodiment as shown in FIG. 6, one suitable material may be a hybrid material that forms a plurality nanolaminate layers. Specifically, the device may use an inorganic/organic hybrid barrier nanolaminate film 100. Although the film 100 may be configured to cover all sides of the solar cell 10, FIG. 6 shows that the protective film 100 may also be configured to selectively cover only the top and sides of the solar cell 10. Optionally, still further embodiments may only cover a top surface of the solar cell 10 that receives sun light.

Referring now to FIG. 7, the protective film 100 will be described in further detail. The film 100 generally includes multiple alternating layers 102 of organic material and layers 104 of inorganic material. These layers may be covalently bonded layers, having covalent bonds between material in the organic layer 102 and material in an adjacent inorganic layer 104. The adjacent organic layers and inorganic layers may be covalently bonded layers characterized by direct organic polymer-inorganic material covalent bonds. The thickness of the inorganic layers 102 and organic layers 104 can be from about 0.1 nm to about 1 nm or from about 1 nm to about 10 nm or from about 1 nm to about 100 nm. The inorganic layers 102 can be silicates, although other inorganic materials can be formed from suitable alkoxides as described below. In some embodiments, the inorganic layers 102 may be functionalized inorganic layers. The protective film 100 can be made substantially transparent by appropriate choice of the number, thickness, and composition of the inorganic layers 102 and organic layers 104. The organic layers 104 may be polymers such as polyethylene naphthalate (PEN), polyether etherketone (PEEK), or polyether sulfone. In addition, polymers created from styrene polymer precursors, methyl styrene polymer precursors, (meth)acrylate polymer precursors, both fluorinated and non-fluorinated forms of these precursors, and combinations of two or more of these precursors can be used as the organic layers 104. Other suitable materials can be found in commonly assigned, copending U.S. patent application Ser. No. 10/698,988 filed Oct. 21, 2003 which is fully incorporated herein by reference.

Although a relatively small number of layers are shown in FIG. 7 for the sake of clarity, a barrier film for a typical device can have many more layers, e.g., several thousand. The multilayer structure of the barrier film 100 provides a long path for water or oxygen to penetrate the barrier film to an underlying substrate 106, e.g., via pinholes and/or gaps at interfaces between layers as indicated by the path 108. The permeability of the nanolaminate barrier film 100 to oxygen and water vapor can be adjusted by changing the number of layers. By using hundreds to thousands of interdigitated inorganic layers 102 and organic layers 104 within the barrier film 100, the large number of layers combined with randomly located pinholes within the nanolaminate results in tortuous paths for molecules such as water vapor and oxygen that might enter from the environment outside of the barrier film 100. The more layers, the more tortuous the path for permeating molecules. Thus, the more layers, the less permeable the barrier film 100 is to water vapor and oxygen. In embodiments of the present invention, there can be 100 or more, 1000 or more, 10,000 or more or 100,000 or more individual layers in the composite barrier film 100.

By suitable choice of the number and composition of layers, the oxygen permeability of the barrier film 100 can be made less than about 1 $cc/m^2/day$, 0.1 $cc/m^2/day$, 0.01 $cc/m^2/day$, $10^{-3}$ $cc/m^2/day$, $10^{-4}$ $cc/m^2/day$, $10^{-5}$ $cc/m^2/day$, $10^{-6}$ $cc/m^2/day$, or $10^{-7}$ $cc/m^2/day$. Similarly, the water vapor permeability of the barrier film 100 can be made less than about 1 $g/m^2/day$, 0.1 $g/m^2/day$, 0.01 $g/m^2/day$, $10^{-3}$ $g/m^2/day$, $10^{-4}$ $g/m^2/day$, $10^{-5}$ $g/m^2/day$, $10^{-6}$ $g/m^2/day$, or $10^{-7}$ $g/m^2/day$. In one embodiment, the water vapor permeability barrier is $10^{-3}$ $g/m^2/day$ or better (i.e. less permeable). In another embodiment, the water vapor permeability barrier is $10^{-4}$ $g/m^2/day$ or better (i.e. less permeable).

The nanolaminate barrier film 100 can be made in a single-step or in a multiple-step process by self-assembly using sol-gel techniques. Self-assembly of nanocomposite materials using sol-gel techniques is described, e.g., in U.S. Pat. No. 6,264,741 to Brinker et al., the entire contents of which are incorporated by reference. The substrate 106 can optionally be coated with the sol mixture by any suitable technique, such as dip coating, spin coating, spray coating, web coating, or microgravure web coating. Suitable coating machines are commercially available, e.g., from Faustel, Inc., of Germantown, Wis. In particular, a Continuous Coater Type BA from Werner Mathis AG of Zurich, Switzerland may be used to coat the substrate with the sol mixture. It is desirable to coat the substrate with the sol in a wet layer approximately 1 microns to 10 microns to 100 microns thick. Thicker wet layers, e.g., about 100 microns to about 1 millimeter thick, can also be used. Since the barrier film 100 can be fabricated without the use of vacuum equipment, the processing is simple and comparatively low in cost.

The resulting nanocomposite structure in the multi-layer film is stabilized by (a) organic polymerization, (b) inorganic polymerization, and (c) covalent bonding at the organic interfacial surfaces. A single coating step can produce films at least 1000 nm thick comprised of individual layers, each roughly 1 nm thick. By taking advantage of the self-assembling nature of the materials, each set of 1000 layers can be formed in only seconds. A greater number of layers in the resulting barrier film can be obtained by repeating the coating and evaporation sequence multiple times and/or by depositing thicker coatings.

Figure 8:
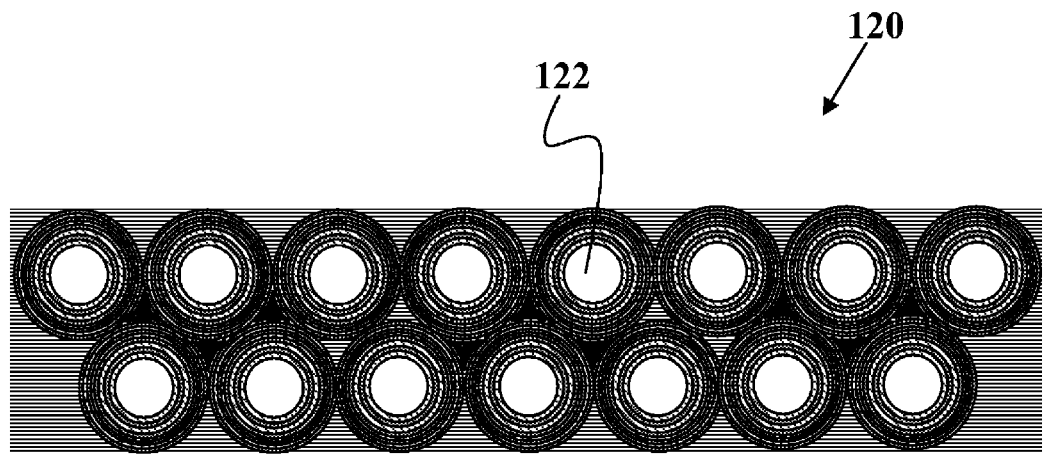
FIG. 8 shows one embodiment of a templated hybrid organic/inorganic protective layer according to one embodiment of the present invention.

Referring now to FIG. 8, a still further embodiment of the present invention comprising of a templated/waveguide barrier layer will now be described. The nanolaminate barrier film 100 described above is typically configured as a plurality of horizontal layers of silica and horizontal layers of hydrophobic polymer. When contaminants such as water or oxygen enter the nanolaminate, the movement of the contaminant molecules occurs through randomly distributed pinholes in these horizontal layers.

As seen in FIG. 8, although such a film 100 is effective, barrier qualities of such a film may be further improved by creating a templated barrier film 120. The embodiment of the nanolaminate in FIG. 8 is formed as a templated nanolaminate barrier film 120 through the addition of beads 122. The beads 122 may be made from a variety of materials including but not limited to silica, glass, or other transparent inorganic materials. The beads 122 may come in a variety of shapes such as spherical, platelet, flake, or the like. The beads 122 as measured in the direction of their largest dimension may be sized between about 1 nm to about 10 microns. In one embodiment, the beads 122 are all of substantially uniform size. In other embodiments, the beads 122 are sized to be within 5-10% of each other. In still other embodiments, a wide variety of bead sizes are used. The beads 122 are of submicron sizes in one embodiment.

The addition of beads 122 enhances the barrier qualities of the film by minimizing the tortuous paths passing through the film 120. Instead of the various tortuous paths leading through the film, the tortuous paths in the film 120 lead toward the individual beads 122 which are dead-end paths. With sufficiently high numbers of beads, contaminants will more likely than not follow a tortuous path to a bead 122 instead of a tortuous path that leads to the other side of the film 120. This significantly improves the quality of the barrier since even if a contaminant traverses the tortuous path, the path fails to lead to the other side of the film 120.

Figure 9:
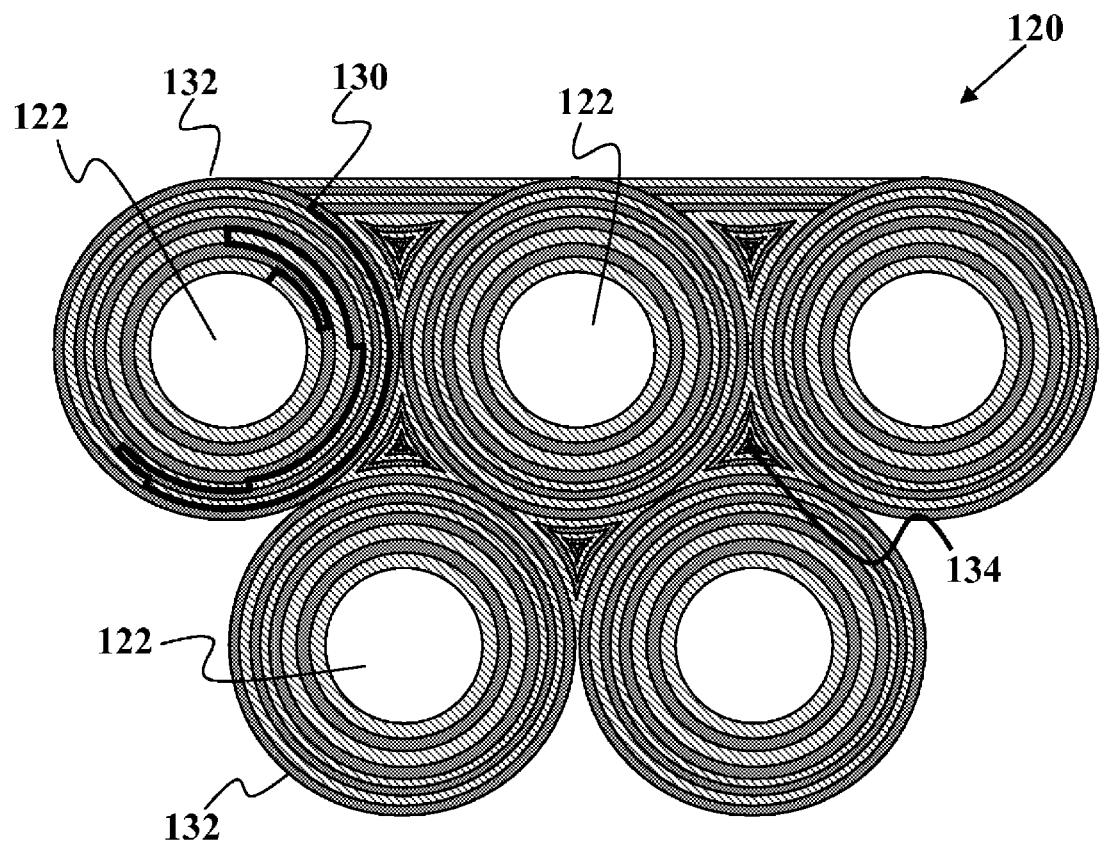
FIG. 9 shows a close-up view of the templated hybrid organic/inorganic protective layer according to one embodiment of the present invention.

FIG. 9 is an enlarged view showing the templated nanolaminate layer 120 in more detail. As a nonlimiting example, one possible tortuous path 130 is shown leading from an outer, concentric nanolaminate layer 132 to the bead 122. Very few paths if any lead through one side of the layer 122 to the other side of the layer 122. Most paths will eventually encounter one of the many concentric layers 132 around the beads 122 and be lead toward a dead-end instead of along a path through the layer 132. Additionally, areas 134 between coated nanolaminated glass beads 122 (e.g. interstitial volume) may be non-templated nanolaminate (shown here schematically) and not open voids.

By way of example and not limitation, the concentric nanolaminate layer 132 may alternate between an inorganic layer and an organic layer. In one embodiment, the nanolaminate layers 132 may be 1 nm thick layers alternating between layers of $SiO_2$ and layers of hydrophobic polymer. Other self-assembled layers may have other configurations with variations on the number of alternating layers.

The use of beads 122 in the templated nanolaminate will advantageously provide at least some of the following benefits. As a nonlimiting example, incorporation of solid glass beads 122 allows for higher average glass density in the overall film since bead glass will be higher density (2 g/cc) than sol-gel glass (1.7 g/cc). Additionally, unlike non-templated nanolaminate layers, templated nanolaminate film will drive contaminants such as water or oxygen vapor molecules from the outside of the coating to the bead, where contaminant molecules become trapped and cannot easily exit the film. Since the only way the contaminant molecules can exit are through those same entry paths (molecular waveguides), and by exiting, they block further entry of other molecules. Accordingly, the steady-state permeation rate will be low on average throughout the structure. As a further advantage, the tortuous path length per unit coating volume should also increase through the use of the beads 122.

By way of example and not limitation, these beads 122 may be added to the dispersion before, during, and/or after solution coating of the material for forming a nanolaminate film similar to that for forming film 120. With the beads 122 present during the self assembly process, the concentric nanolaminate layers may form around the beads 122 to create the templated nanolaminate barrier film 120. The beads 122 may be in the form of a dry powder and/or in a dispersion added to another dry powder, dispersion, and/or emulsion. The suspension may be applied over the photovoltaic cells or other layer by any of a variety of solution-based coating techniques including, but not limited to, wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, and the like, as well as combinations of the above and/or related technologies. Optionally, it should be understood that the beads are not limited to spherical shapes and may be particles having planar, oblong, or other shapes.

It should be understood that other types of barrier coatings, such as described by J. D. Affinito and D. B. Hilliard in U.S. Appl. No. 20050051763, "Nanophase multilayer barrier and process", and by A. G. Erlat, et al., in the Proceedings of the SVC, 2005, pp. 116-120, and T. W. Kim, et al., US. Appl. No. 20060003189, "Barrier coatings", may also be applied to the solar cell, the solar cell string, or the packaging. Additionally, multilayer composites such as those described by the tradename "ORMOCER" and developed by the Fraunhofer Institute for Silicate Research, Neunerplatz 2, Wuerzburg, Germany, and disclosed in U.S. Pat. No. 6,503,634 may be advantageously used. All of the above referenced publications are fully incorporated herein by reference.

Applying a Protective Layer to the Solar Cell

Figure 10:
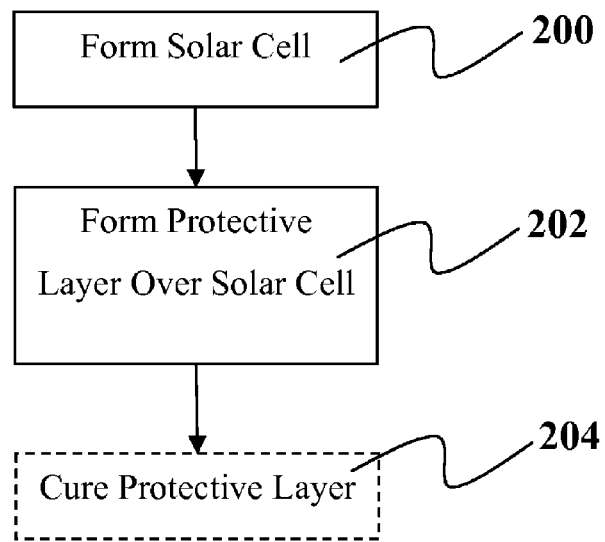
FIG. 10 is a schematic showing one method of forming the protective layer according to various embodiments of the present invention.

Referring now to FIG. 10, it should be understood that there are a variety of methods to form the protective layer over the solar cell 10. Step 200 shows that the solar cell or other photovoltaic device is formed. At step 202, the protective layer is formed over the solar cell or photovoltaic device. Some embodiments of the protective layers 20 may be applied by ALD and other vacuum deposition processes. Optionally, other embodiments of the protective layers 20 may be formed by a solution deposition process. Solution depositing the material may be comprised of using at least one of the following techniques: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, aerosol spray deposition, dip coating, web coating, microgravure web coating, or combinations thereof. The solution deposition process may be applied in a single coat or in multiple coats. This may address any imperfections that may be present in the layer if only one coat is applied. Any of the foregoing may be applied in a roll-to-roll process or in a batch process.

Optionally, in other embodiments, the protective layers 20, 100, and 120 may be applied as pre-formed sheets that are laminated onto the solar cell 10. The protective layers 20, 100, and 120 may be applied in single ply sheets or multiple ply sheets. Optionally, more than one sheet may be applied to each solar cell.

As seen in FIG. 10, the protective layers 20, 100, and 120 formed by solution deposition may optionally be further processed to cure the protection layer at step 204 (shown in phantom). The curing may involve ultraviolet techniques, electron-bean irradiation techniques, other radiation techniques, thermal techniques, or other curing techniques.

Figure 11:
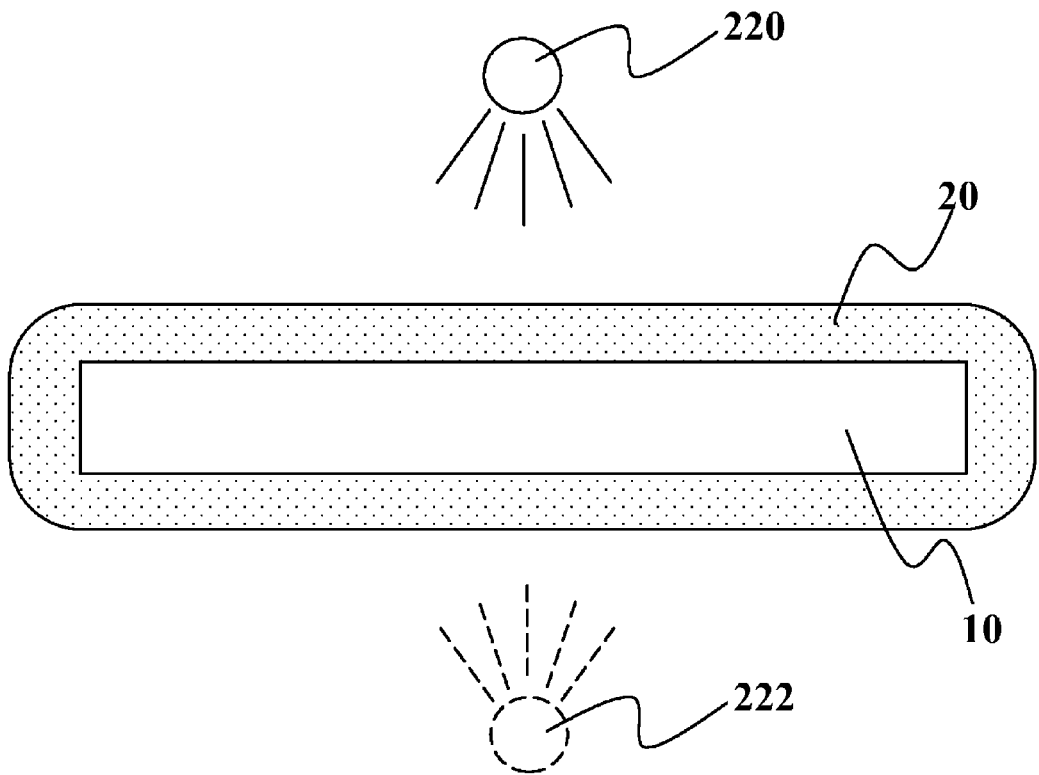
FIG. 11 shows one embodiment of a method for curing a protective layer according to the present invention.

Referring now to FIG. 11, if an ultraviolet technique is used for curing the protective layer, one or more ultraviolet lamps may be provided. As seen in FIG. 11, the lamp 220 (and optionally a second lamp 222) may generate ultraviolet light having a wavelength in the range of approximately 300 nm to 400 nm since the effective wavelength spectrum for curing one embodiment of the material may be in the 300 nm to 400 nm region. Of course, wavelength spectrum of the lamp or lamps may be varied to optimize curing of the material. The lamps 220 and 222 may be supported by and electrically connected to suitable fixtures. UV light may be provided with mercury vapor lamps from UVEXS, Inc. Model CCU or Model 912 curing chambers (Sunnyvale, Calif., U.S.A.). The lamp may optionally be a xenon, metallic halide, metallic arc, or high, medium, or low pressure mercury vapor discharge lamp. Of course, it should be understood that one or more lamps or UV sources may be used to facilitate curing of the hardcoat composition. Any of the foregoing may be applied in a roll-to-roll process or in a batch process.

Optionally, as seen in FIG. 10, the entire cell string 250 may be coated with a protective layer 20. FIG. 10 shows that the entire cell string 250 may be lowered into a bath 252 of protective material as indicated by arrow 254. The coated cell string 250 is then removed from the bath and the protective layer cured onto the cell string 250. Of course, any of the other deposition techniques described herein may also be used, including: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, aerosol spray deposition, dip coating, web coating, microgravure web coating, or combinations thereof. The solution deposition process may be applied in a single coat or in multiple coats. This may address any imperfections that may be present in the layer if only one coat is applied. Any of the foregoing may be applied in a roll-to-roll process or in a batch process. Some assembly methods may first individually coat each cell 10 and then coat the entire string 250 after the cells 10 are strung together. Optionally, the cells 10 are uncoated and then coated all at once as shown in the embodiment of FIG. 10.

Preferably, the solar cells 10 with the protective layer 20 will have a water vapor transmission rate (WVTR) sufficiently low so that there is substantially no loss in solar cell conversion efficiency when the cell is exposed for 1000 hours at 85° C. and 85% relative humidity. Alternatively, the WVTR of the protective layer 20 is such that the conversion efficiency of a cell with the layer 20 has a conversion efficiency at least 25% better than an unprotected cell after both are exposed for 1000 hours at 85° C. and 85% relative humidity. In another embodiment, the cell with layer 20 has a conversion efficiency at least 50% better than an unprotected cell after both are exposed for 1000 hours at 85° C. and 85% relative humidity. In another embodiment, the cell with layer 20 has a conversion efficiency at least 75% better than an unprotected cell after both are exposed for 1000 hours at 85° C. and 85% relative humidity. In another embodiment, the cell with layer 20 has a conversion efficiency at least 100% better than an unprotected cell after both are exposed for 1000 hours at 85° C. and 85% relative humidity.

Modules with Individually Encapsulated Solar Cells and/or Cell Strings

Figure 13:
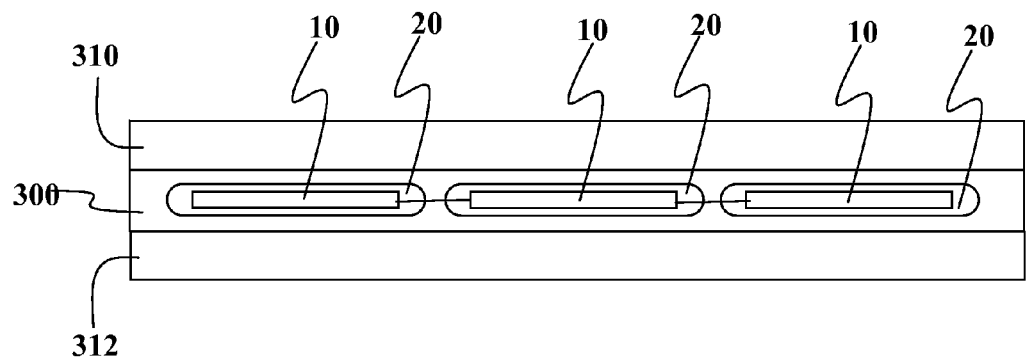
FIG. 13 is a cross-sectional view showing a module with individually encapsulated solar cells according to one embodiment of the present invention.

Referring now to FIG. 13, one embodiment of a module using encapsulated solar cells will now be described. FIG. 13 shows a plurality of individually encapsulated cells 10 mounted in the layer 300. If the layer 300 is a rigid layer, it may involve mounting each of the solar cells 10 on a substrate such as but not limited to glass, soda-lime glass, steel, stainless steel, aluminum, polymer, ceramic, metal plates, metallized ceramic plates, metallized polymer plates, metallized glass plates, and mixtures thereof. The solar cells themselves may be flexible or rigid. If the layer 300 is a flexible layer, the solar cells 10 may be mounted on a flexible substrate such as but not limited to specialty thin, crack-resistant glass microsheet from Schott AG of Germany, coated steel foil (with a corrosion-resistant coating), stainless steel foil, aluminum foil, polymeric-material films, ceramic coatings on metal foil or polymer film, and combinations thereof. In some embodiments, the layer 300 such as but not limited to aluminum foil or stainless steel foil is electrically conductive and can be designed to have electrically conductive diffusion barrier layers. This allows the layer 300 to carry electrical current and reduce thickness of various layers used in the device. Again, the solar cells 10 themselves may be flexible or rigid. It should also be understood that the embodiment may use a superstrate or substrate configuration as understood by those skilled in the art.

Advantageously, because each solar cell may optionally be individually protected, materials previously deemed unsuitable may be adapted for use with the present invention. As seen in FIG. 13, because each solar cell 10 in layer 300 is individually encapsulated, some embodiments of the present invention may use layers 310 and 312 with relaxed protective qualities. By way of nonlimiting example, the layer 310 may be a flexible layer that may have enhanced scratch resistance but reduced moisture barrier properties. Optionally, in another embodiment, the moisture barrier properties of layer 310 are enhanced while scratch resistance may be reduced. Optionally, the edge tape 54 may be left off since the cells themselves are individually encapsulated. Optionally, the layer 310 may be a rigid layer of reduced thickness to reduce the materials cost for each module.

Figure 14:
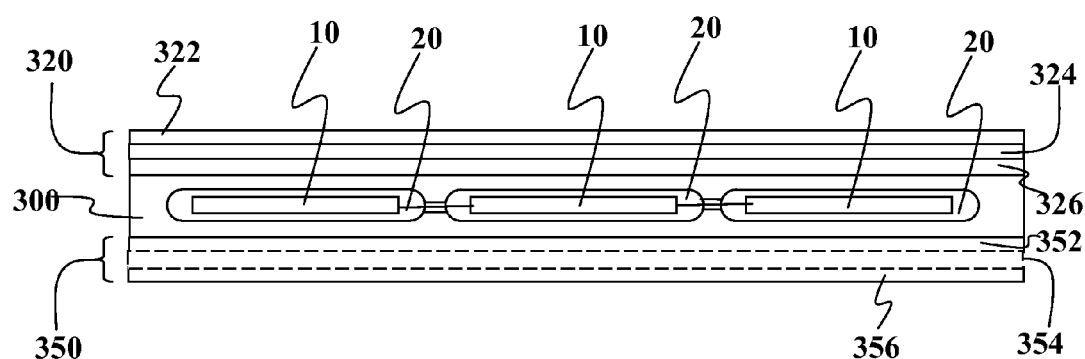
FIG. 14 is a cross-sectional view showing a module with multi-ply layers around individually encapsulated solar cells according to one embodiment of the present invention.

Referring now to FIG. 14, embodiments of the present invention may provide improved configurations that add further protective capabilities to the embodiments shown in FIG.

13. FIG. 14 shows that a plurality individually encapsulated solar cells 10 in a multi-ply module packaging that may allow for best in class materials to be used. Although not limited to the following, it should be understood that the substantially organic material, substantially inorganic material, hybrid organic/inorganic material, and the various techniques for applying those layers may be adapted for use to form the various module level barrier and/or encapsulant layers for FIGS. 13 and 14.

As seen in FIG. 14, a multi-ply encapsulant layer 320 is shown at a position above the photovoltaic layer 300. In this position above the photovoltaic layer 300, the encapsulant layer 320 is of sufficient transparency to allow light to pass through the multi-ply layer 320 to reach the photovoltaic layer 300. In the embodiment shown in FIG. 12, the encapsulant layer 320 may be comprised of a plurality of individual layers 322, 324, and 326. It should be understood that some embodiments of the present invention may use an encapsulant layer 320 comprised of only two layers. In other embodiments, the encapsulant layer 320 may be comprised of four layers or more. In the present embodiment, the layers 322, 324, and 326 are preferably highly transparent to solar radiation over a wide range of wavelengths such as but not limited to visible, infrared, and/or near ultraviolet wavelengths. Optionally, the layers 322, 324, and 326 may have a thickness and elastic range-of-motion combination that enables flexibility for the encapsulant layer 320. As a nonlimiting example, the layer 320 may have a flexibility sufficient to roll up on a round core of about 0.01 to about 2.0 m radius, about 0.02 to about 1.0 m radius in another embodiment, and between about 0.06 to about 0.5 m radius in yet another embodiment.

In one embodiment of the present invention, layer 322 may have reasonable scratch resistance. Although not limited to the following, scratch resistance can be quantified by the ASTM D3363 pencil scratch test, where scratch resistance versus 1H, 2H, 3H, 4H, or harder pencil leads is desirable. Scratch resistance can also be quantified by the ASTM D1044 Taber abraser test, where a grinding wheel of specified roughness, specified downward force, and specified number of rotation cycles is used to rub the surface under test. The amount of mass abraded away or the optical haze induced by the abrasion is the measured response to quantify scratch resistance. For a CS-10F test wheel with 500 gram-force (4.9N) downward, it is preferable to have less than 10% optical haze after 50 wheel revolutions. Haze is measured per ASTM D1003.

The layer 322 may optionally be highly UV resistant. This may comprise of resistance to UV-induced embrittlement, powdering, chalking, and discoloration for certain periods of exposure. UV-test per UV exposure from a xenon arc lamp, such as embodied in the QUV instrument from Q Panel Corp. The layer 322 may optionally have ultraviolet blocking ability to protect one or more layers below the layer 322 or the top layer in the encapsulant layer 320. As a nonlimiting example, the layer 322 may comprise of a co-polymer of ethylene and tetrafluoroethylene (ETFE), or silica-nanoparticle-filled, UV-resistance-additive-containing acrylic scratch resistant hard coat rated at 2H, 3H, or 4H pencil scratch resistance, or a weatherable silicone-based hard coat. The ETFE may be a modified ETFE (ethylene-tetrafluoroethylene) fluoropolymer such as but not limited to Tefzel®.

The layer 324 may optionally include properties that might separate out the function of either and/or both layer 322 or layer 326. The layer 324 may optionally provide one or more of the following: good adhesion between layer 322 and layer 326; enhanced barrier properties to diffusion of water molecules or oxygen molecules; or enhanced ultraviolet resistance; or provide better light transmission by having an intermediate index of refraction that is between the indices of refraction of layers 322 and 326. As a nonlimiting example, the layer 324 may be a difunctional molecular monolayer where one chemical functional group bonds well to layer 322 and another chemical functional group bonds well to layer 326. Optionally, the layer 324 may be a thin adhesive layer made from a version of layer 322 and/or a version of layer 326 that has been modified to enhance the bonding of layer 322 and layer 324. In other embodiments of the invention, the layer 324 may be a thin-film (nanofilm) of a barrier material such as but not limited to sputtered silicon dioxide ($SiO_2$), aluminum oxide ($Al_2O_3$), or other transparent oxide, a hybrid inorganic-organic barrier coating, such as ultra-high barrier coating which comprises silicon oxides, nitrides, and organic Si containing plasma polymer with nondiscrete interfaces marketed for organic light emitting displays (OLEDs). Layer 324 can also consist of sublayers of alternating organic/inorganic barrier layers, such as Vitex Barix barrier layer marketed for OLEDs. In some embodiments, the layer 324 may include a notch filter layer to pass wavelengths that are a subset of light wavelengths. The layer may include a filter selected from one of the following to pass a desired set of light wavelengths: bandpass filter, high-pass filter, or low-pass filter.

The layer 326 may optionally be a thermoplastic polyurethane, a thermosetting ethylene vinyl acetate (EVA), a thermoplastic fluoropolymer such as a copolymer of tetrafluoroethylene, hexafluoropropylene and vinylidene fluoride (THV), a silicone based material, and/or a thermoplastic ionomer resin such as but not limited to DuPont Surlyn®. In one embodiment, the layer 326 comprises of a thermoplastic polyurethane such as but not limited to Desmopan® aliphatic ester thermoplastic polyurethane from Bayer or Dureflex® A4700 aliphatic ether thermoplastic polyurethane from Deerfield Urethane. The A4700 properties include a nominal Shore A hardness of 78 measured per ASTM D2240, specific gravity of 1.08 measured per ASTM D792, a nominal 100% elongation modulus of 3.5 MPa measured per ASTM D882, a nominal tear resistance of 4.37 N/mm measured per ASTM D1004, an optical haze below 1% on Hazegard instrument per ASTM D1003-61. Other materials with similar performance qualities in the range of those listed above (+/−within about 5% to 10%) may of course be used in place of and/or in combination with those listed above. The thickness of layer 326 is between 10 microns and 1000 microns, between 10 microns and 500 microns in another embodiment, and between 100 and 300 microns in a still further embodiment.

It should be understood that the multi-ply encapsulant layer 320 is not limited to the layers shown in FIG. 14. Other embodiments of the multi-ply encapsulant layer 320 may include additional layers of material to add additional protective qualities. Other embodiments of the encapsulant layer 320 may include additional layers of the same materials or may be layers of different materials than those found in layers 322, 324, and/or 326. The layers may also be used with edge tape 54 as suitable.

Figure 12:
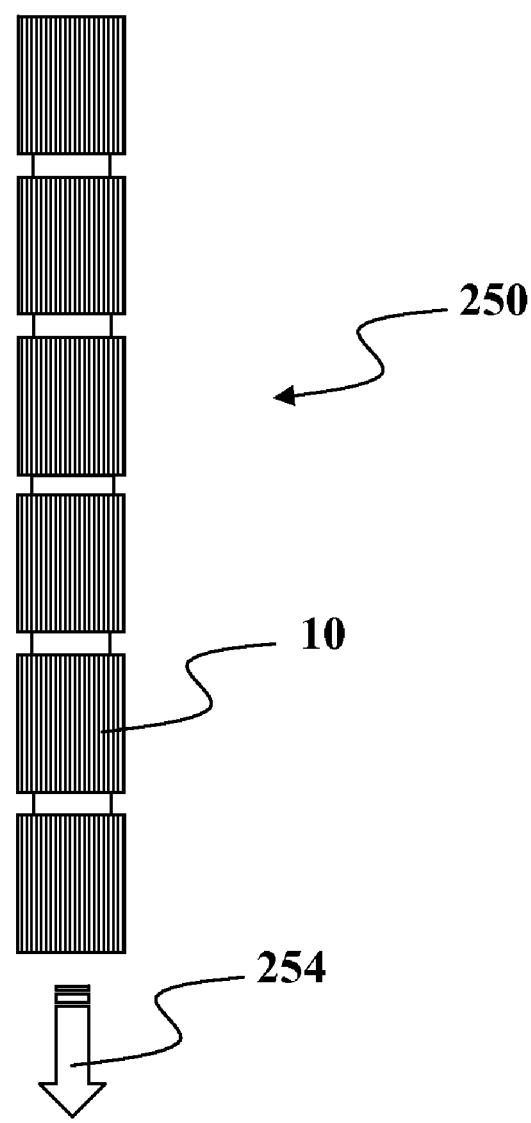
FIG. 12 shows one embodiment of a method for coating a cell string with a protective layer according to the present invention.
Figure 12:
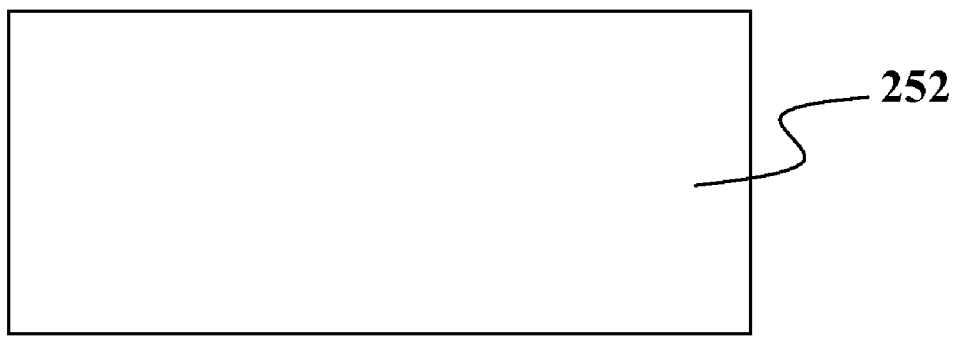

Referring still to FIG. 14, a multi-ply encapsulant layer 350 may be coupled to an underside of the photovoltaic layer 300. FIG. 14 shows that the encapsulant layer 350 may also comprise of a plurality of layers of materials. Some embodiments of the encapsulant layer 350 may comprise of more than those shown in FIG. 14. It should also be understood that some embodiments may have fewer layers. As a nonlimiting example, FIG. 12 shows that the encapsulant layer 350 may also comprise of layers 352, 354, and 356. Optionally, some embodiments may only have two discrete layers. Others may have four or more discrete layers that bond together to form encapsulant layer 350. In one embodiment of the present invention, layer 352 may be an opaque version of one of the materials used in layer 356. Optionally, it may be a lower cost material with opaqueness or reduced UV-resistance properties.

Layer 354 may be one of materials suitable for use in layer 324 or additionally it can be an opaque version of layer 324. Such an opaque layer may be created by adding a pigment selected from the following list: carbon black, titanium dioxide, or any stable inorganic pigment. In another embodiment, the layer may be a lower cost material with opaqueness or reduced UV-resistance properties, such as but not limited to aluminum foil, stainless steel foil, other types of metal foils.

Layer 356 may be one of the materials suitable for use in layers 322 and 324 or additionally it can be an opaque version of layer 322 and layer 324 materials. In one nonlimiting example, layer 356 may be selected from the following example conventional back sheets: Tedlar®-polyester-Tedlar® (TPT), Tedlar®-polyester (TP), Tedlar®-aluminum-polyester (TAP), Tedlar®-aluminum-polyester-Tedlar® (TAPT), Tedlar®-aluminum-polyester-EVA (TAPE). These conventional back sheets also contain adhesive tie layers and adhesion-promoting surface treatments that are proprietary to the back sheet vendors. Conventional back sheets are available from Isovolta of Austria and Madico of USA. Layer 356 may optionally be selected from the following example unconventional back sheets: aluminum sheet; galvanized steel; Galvalume® 55% aluminum-zinc alloy coated sheet steel; conversion-coated steel such as chromate-based, phosphate-based, or similar corrosion-resistant coated sheet steel; plasticized or unplasticized polyvinylchloride (PVC) formulations; aliphatic ether or aliphatic ester or aromatic ether or aromatic ester thermoplastic polyurethanes; ethylene-propylene-diene (EPDM) rubber sheet; thermoplastic polyolefin (TPO) sheet, polypropylene sheet, polyethylene sheet, polycarbonate sheet, acrylic sheet, and/or single or multiple combinations thereof.

It should be understood that a variety of processes may be used to form the various protective layers on the photovoltaic layer 300. The layers may be integrally formed, dipped, coated, solution deposited, laminated, otherwise formed, or any single or multiple combinations thereof. One mode of lamination for EVA encapsulant is a vacuum lamination at about 135 C, 1 atm pressure, for 10 to 30 minutes, a thermoset process. In a roll-to-roll process, the vacuum laminator may have either a continuous motion or a step-and-repeat motion within to both match the production line rate and the time required for EVA lamination.

One mode of lamination for TPU encapsulant and any other layer herein is hot nip lamination, where the high temperature and high pressure pair of nip rolls quickly laminate the layers together. The temperature of the nip rolls is between 85° C. and 250° C., between 100° C. and 200° C. in another embodiment, and between 125° C. and 200° C. in a still further embodiment. The pressure is indirectly defined through the nip roll diameter, the deformation properties of the materials to be laminated, the downward force of the nip roll onto the materials to be laminated. The downward force is a combination of the weight of the nip roll, any upward force from optional hard stops that prevent the nip roll from moving downward past a certain point, any downward force applied by hydraulic or pneumatic cylinders with adjustable set points such as a regulator that down-regulates a compressed air supply to a certain air pressure. The appropriate pressure for a given set of materials and lamination speed is determined without undue experimentation by starting at zero cylinder force and increasing the force until air-bubble-free adherent laminates are formed.

Manufacturing

A variety of techniques can be used to manufacture cells, cell strings, and/or solar cell modules with the protective layers described herein. The type of manufacturing and/or assembly technique may vary based on whether the solar cell itself is a rigid device or a flexible device.

Figure 15:
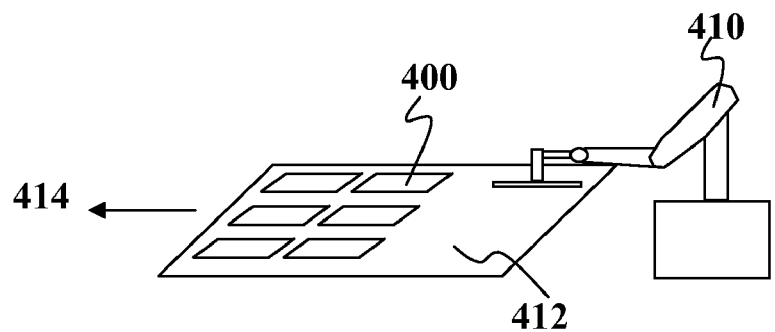
FIG. 15 shows a technique for handling rigid substrate according to one embodiment of the present invention.

Referring now to FIG. 15, it should be understood that the embodiments of the present invention may be suitable for use on a rigid substrate 400. By way of nonlimiting example, the rigid substrate 400 may be glass, soda-lime glass, steel, stainless steel, aluminum, polymer, ceramic, coated polymer, or other rigid material suitable for use as a solar cell or solar module substrate. A high speed pick-and-place robot 402 may be used to move rigid substrates 400 onto a processing area from a stack or other storage area. FIG. 13 shows how a pick-and-place robot 410 may be used to position a plurality of rigid substrates on a carrier device 412 which may then be moved to a processing area as indicated by arrow 414. This allows for multiple substrates 400 to be loaded before they are all moved together to undergo processing. It should be understood that processing as described may be any of a variety of processes. The processing may be to coat the individual cells in a batch process, to couple the individual cells into a string, to mount individual cells onto a module or assembly, or to laminate the cells to a module or assembly.

Figure 16:
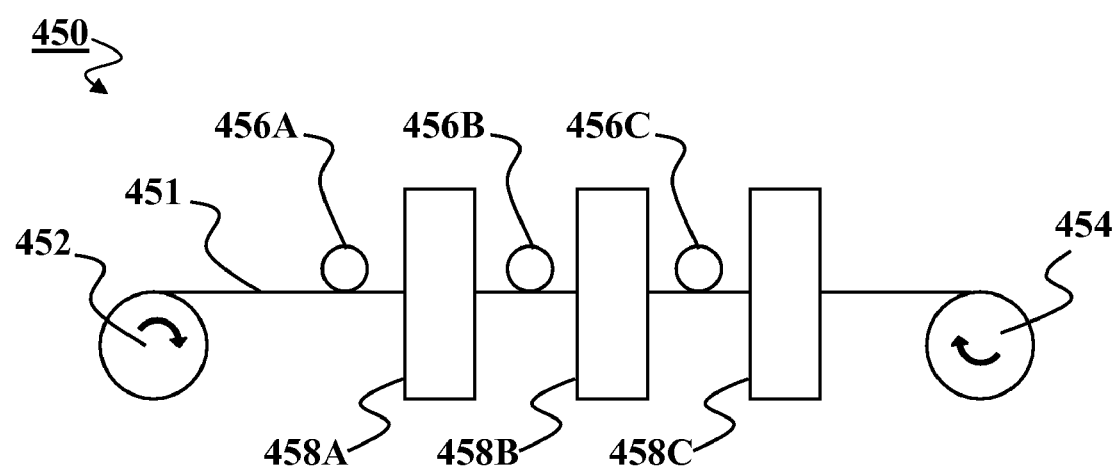
FIG. 16 shows a roll-to-roll technique for applying a protective layer according to one embodiment of the present invention.

Referring now to FIG. 16, it should also be understood that the embodiments of the present invention may be suitable for use on a flexible substrate in a roll-to-roll manufacturing process. Specifically, in a roll-to-roll manufacturing system 450, a flexible substrate 451 travels from a supply roll 452 to a take-up roll 454. In between the supply and take-up rolls, the substrate 451 passes a number of applicators 405A, 456B, 456C, e.g. microgravure rollers, and processing units 458A, 458B, 458C. Each applicator deposits a layer or sub-layer as described above. The processing units may be used to cure each layer and/or promote adhesion between layers. In the example depicted in FIG. 14, applicators 456A and 456B may apply different sub-layers of the protective layer. Processing units 458A and 458B may cure each sub-layer before the next sub-layer is deposited. Alternatively, both sub-layers may be cured at the same time. Applicator 456C may optionally apply an extra layer of material above the other layers. Processing unit 458C heats the optional layer and precursor layer as described above. Note that it is also possible to sequentially deposit all layers together which is then cured or processed to form the protective layer. The roll-to-roll system may be a continuous roll-to-roll and/or segmented roll-to-roll, and/or batch mode processing.

Figure 17:
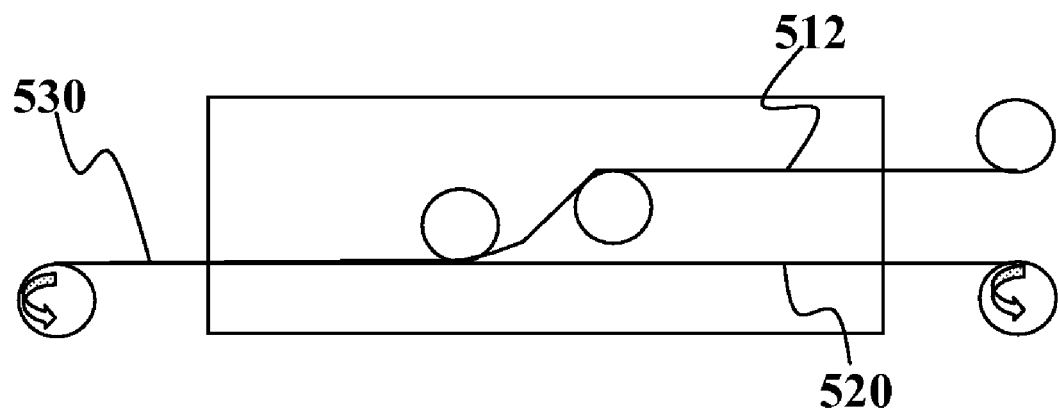
FIG. 17 shows another roll-to-roll technique for applying a protective layer according to one embodiment of the present invention.

Referring now to FIG. 17, it should be understood that the present invention may also be well suited for module assembly via a variety of processes including, but not limited to, a roll-to-roll process. The photovoltaic cells 512 themselves may be manufactured using a roll-to-roll process. The cells 512 may then be processed and assembled in strings of cells 512. Then, the assembly of a string of cells 512 and the support substrate 520 may also be combined together using a roll-to-roll assembly process where rollers may be used to bring the two together as seen in FIG. 15. Optionally, a roll of support substrate 520 may be unrolled and brought together with one or more strings of photovoltaic cells 512. Subsequently, the combined multi-layer assembly 530 may enter a laminator to complete the assembly process. As a nonlimiting example, one method of lamination for an EVA encapsulant for use with the roofing assembly is vacuum lamination at about 135° C., 1 atm pressure, for 10 to 30 minutes, in a thermoset process. In a roll-to-roll process, the vacuum laminator is a long piece of capital equipment that has continuous or step and repeat motion within to match the production line rate with the time required for EVA lamination. One mode of lamination for TPU encapsulant is hot nip lamination, where the high pressure and temperature rolls quickly laminate the layers together. The heating is to bring the TPU to a hot, soft state for bonding and post-nip cooling is to harden the encapsulant. This thermoplastic process is much faster than the EVA thermoset, on the order of about 10× faster. The capital equipment for roll-to-roll nip lamination is far smaller, simpler, and less costly than roll-to-roll thermoset vacuum lamination. This offsets the higher materials cost of the TPU versus EVA. The lamination process can also include the simultaneous formation of cell-to-cell and cell-to-wiring electrical connections. In this example, cells could be placed on an adjacent layer by a pick-and-place mechanism included in the roll-to-roll process. Other types of lamination suitable for use with the present invention include flatbed roll-to-roll lamination (as provided by Glenro of Paterson N.J.), press lamination, vacuum bag lamination, bath lamination, dip lamination, and/or combinations thereof.

Form Factors

Figure 18:
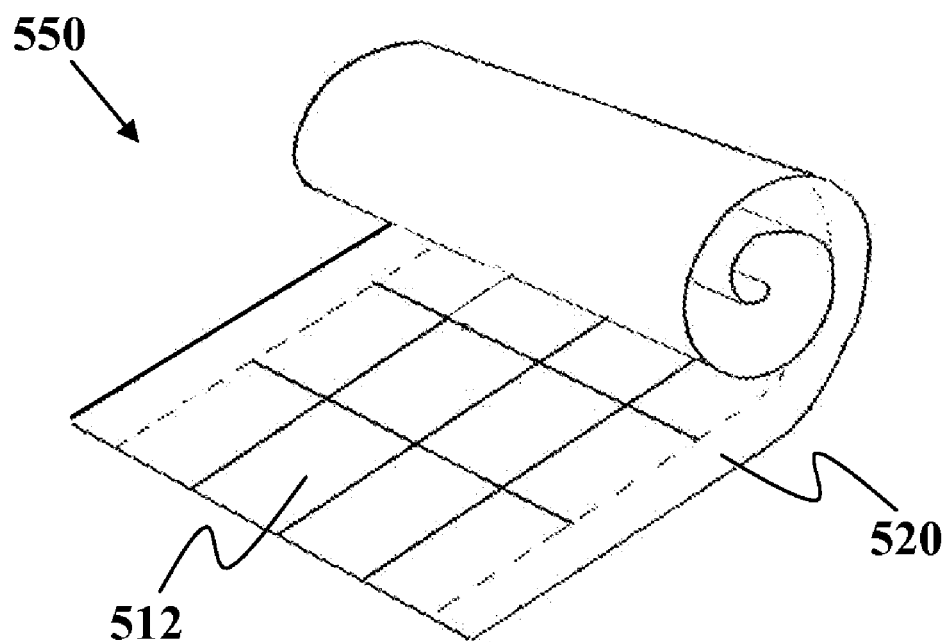
FIG. 18 shows a flexible solar assembly having solar cells with the protective layer according to one embodiment of the present invention.

Referring now to FIG. 18, the support substrate 520 may be a flexible membrane such as a roofing membrane that is combined with the cells 10 or cell strings 512. The resulting photovoltaic roofing membrane 550 with photovoltaic cells 512 may be rolled together and formed in elongated flexible sections of substantially uniform thickness constructed for being rolled up in lengths suitable for being transported to a building site for unrolling and for being affixed to a roof structure. As seen in FIG. 18, the flexible nature of the photovoltaic cells 512 allows them to be rolled up with the roofing membrane 520 without any special mechanical spacers, gaps, or structural alterations found in known devices that use rigid photovoltaic cells. In one embodiment, the rolls are between about 6.5 to about 10 feet wide prefabricated to cover up to the desired area to be covered by one roll. The area may be selected to cover only those areas that receive unobstructed sunlight. In some embodiments, this may be a roll with an area of about 2500 sq ft. In other embodiments, the area may be about 3000 sq ft, 5000 sq ft, 10,000 sq ft, 50,000 sq ft, 100,000 sq ft or more.

As seen in FIG. 18, the rolls formed by the flexible cells and the roofing membrane may have the cells deflecting between about 1 mm to about 1000 mm radius of curvature, between about 5 mm to about 500 mm in another embodiment, and between 10 mm to 100 mm in yet another embodiment, without damaging the cell. The ability of the cell to deflect allows the roofing membrane to be applied to the various contours and shapes on the rooftop without being limited by being a roofing membrane. The relative thinness of the photovoltaic cells also allows the rolls to be handled, rolled, unrolled, and transported with substantially the same equipment used to handle typical, non-photovoltaic roofing membranes.

Figure 19:
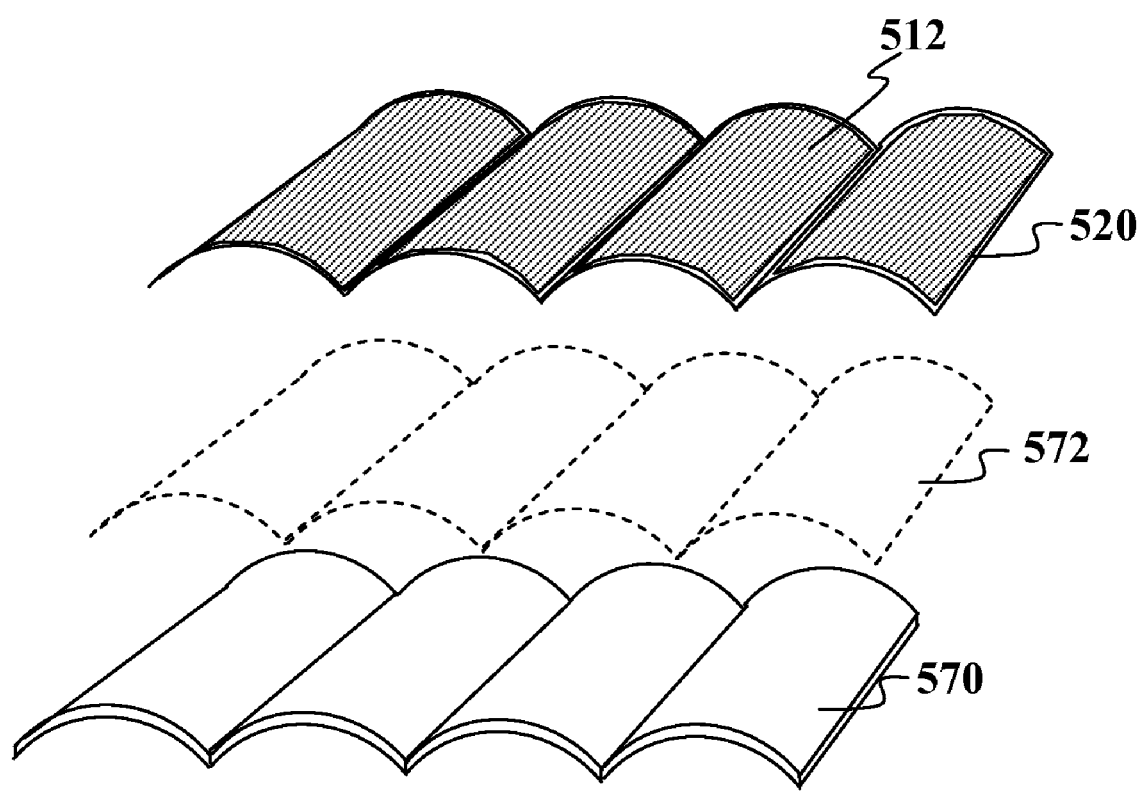
FIG. 19 shows a photovoltaic roofing material having solar cells with the protective layer according to one embodiment of the present invention.

Referring now to FIG. 19, the membrane 520 and photovoltaic cells 512 may be contoured as desired to follow the shape of the underlying support surface that the membrane 520 is mounted on. In FIG. 19, this may be on curved tiles, flat metal plates, copper roofing member, or any other suitable surface 570. These tiles or plates of surface 570 may be individual, discrete elements or contiguous elements. It should be understood that in some embodiments, the membrane 520 may a less weatherproof membrane and rely on the underlying support surface 570 to provide weatherproofing capability. Optionally, a second layer of material 572 may be attached to the roofing membrane 520. The second layer 572 may be used to provide more structural support or it may be used to improve other qualities of the roofing membrane 520. The second layer 572 may be selected from a variety of materials including but not limited to: photonic textiles, metallic yarns, metallized yarns, conductive polymers on fabrics, textile electronics, woven polymers including nylon, mylar (PET), extruded plastics, stamped metals plates, unstamped metal plates, or combinations thereof. Textiles are classified according to their component fibers into silk, wool, linen, cotton, such synthetic fibers as rayon, nylon, and polyesters, and some inorganic fibers, such as cloth of gold, glass fiber, and asbestos cloth. They are also classified as to their structure or weave, according to the manner in which warp and weft cross each other in the loom (see loom; weaving). Value or quality in textiles depends on several factors, such as the quality of the raw material used and the character of the yarn spun from the fibers, whether clean, smooth, fine, or coarse and whether hard, soft, or medium twisted. Density of weave and finishing processes are also important elements in determining the quality of fabrics. GORE-TEX® expanded polytetrafluoroethylene (PTFE), Kevlar® polyaramid, Nylon® polyamide, Neoprene® polychoroprene, Spandex® elastomer, Velcro® hook and loop fastener, polyvinylchloride, and the like may also be used. Flax, cotton, silk, wool, lyocell, microfibers, microdenier, polyolefin, polypropylene, polyester, triacetate, rayon, acetate, and acrylic may also be used.

It should understood that the flexible membranes and solar cells according to the present invention may be used in a variety of other applications such as building facades, tents, roofing tiles, cladding, tarps, awnings, window materials, and the like. Additional examples are set forth in commonly assigned, copending U.S. Provisional Patent Application Ser. No. 60/804,570 (filed Jun. 12, 2006), 60/804,571 (filed Jun. 12, 2006), and 60/746,626 (filed May 5, 2006), fully incorporated herein by reference for all purposes.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, other types of lamination suitable for use with the present invention include flatbed roll-to-roll lamination (as provided by Glenro of Paterson N.J.), press lamination, vacuum bag lamination, bath lamination, dip lamination, or any single or multiple combinations thereof. With any of the above embodiments, elements might be created in situ rather than pre-formed. With any of the above embodiments, elements might be partially created at one stage in the process and finished later in the process. With any of the above embodiments, the term foil can include both metallic foil and non-metallic foil. With any of the above embodiments, the term "rolled up" can include combinations of roll bends and other packing methods such as folds, fanfolds, rounded folds, and rounded fanfolds. Some embodiments of the invention may not have all of the layers recited above. Some may have only multi-layers on the top side. Some may have multi-layers on only the bottom side. Still other embodiments may have multi-layers, but not as many as those shown. Others may have many more layers than those shown. As a non-limiting example, layers 322, 324, and 326 may be repeated on the top side to further improve the level of protection. Some may only repeat selected layers such as 324 and 326. Others may use thicker layers of one material such as top layer 322 for increased protection. Other embodiments may have more layers between layers 322 and 326 and not just one layer 324. The layers may all be of different material compositions. Others may have certain portions that have alternating sets of layers that define a laminate layer. In one embodiment, all topside layers are of sufficient transparency to minimize loss of light as light passes through the layers to reach a photovoltaic cell. Other embodiments may not have the most scratch resistant layer as the outermost layer.

For any of the embodiments herein, the following may also apply. In terms of moisture barrier properties, the barrier to water may be less than 0.1 g/m2/day of water vapor permeation at 25 degrees C. and 50% RH, preferably less than 0.01, most preferably less than 0.001. In terms of other barrier properties, barrier to ions may be less than 0.01 g/m2/day of acetic acid permeation at 25 degrees C. where the acetic acid has a concentration at the outer surface of the barrier layer of $10^{(-4)}$ moles/liter. The barrier to ions is preferably less than 0.001 g/m2/day, most preferably less than 0.0001 g/m2/day. Some embodiments of a module may have all solar cells and/or cell strings with a protective layer. In other embodiments, only some of the cells and/or cell strings have the protective layer. Some may have more than one protective layer on at least one of the cells and/or cell strings. The protective layer may be such as to withstand environmental exposure for about 25 years. During that time, the degradation of conversion efficiency may be less than about 10% loss over the course of 12 years in a typical outdoor installation, less than about 20% loss over the course of 25 years. The optical transparency may be such that in one embodiment, optical transparency comprises of less than 5% haze, preferably less than 3% haze, most preferably less than 1% haze. Although not limited to the following, electrical insulating capability may involve a resistivity greater than $10^9$ ohm*cm, preferably greater than $10^{12}$ ohm*cm, most preferably greater than $10^{15}$ ohm*cm. The substantially organic barrier materials, substantially inorganic barrier materials, and/or hybrid barrier materials may be applied via vacuum and/or non-vacuum techniques as described herein and are not limited to one type of technique or the other.

Although CIGS solar cells are described for the purposes of example, those of skill in the art will recognize that any of the embodiments of the present invention can be applied to almost any type of solar cell material and/or architecture. For example, the absorber layer in solar cell 10 may be an absorber layer comprised of organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, $Cu(In,Ga)(S,Se)_2$, $Cu(In,Ga,Al)(S,Se,Te)_2$, and/or combinations of the above, where the active materials are present in any of several forms including but not limited to bulk materials, micro-particles, nano-particles, or quantum dots. The CIGS cells may be formed by vacuum or nonvacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Many of these types of cells can be fabricated on flexible substrates.

Embodiments of the present invention may also be applied to solar cells with the following features. It should be understood that the P-type layer may be either organic or inorganic. Alternatively, the N-type layer may be either organic or inorganic. The possible combinations may result in an inorganic P-type layer with an inorganic N-type layer, an inorganic P-type layer with an organic N-type layer, an organic P-type layer with an inorganic N-type layer, or an organic P-type layer with and organic N-type layer. By way of nonlimiting example, suitable inorganic materials for the P-type and/or N-type layer include metal oxides such as titania ($TiO_2$), zinc oxide (ZnO), copper oxide (CuO or $Cu_2O$ or $Cu_xO_y$), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium suflide (CdS), copper sulfide (e.g., $Cu_2S$), cadmium telluride (CdTe), cadmium-tellurium selenide (CdTeSe), copper-indium selenide ($CuInSe_2$), cadmium oxide $(CdO)_x$ i.e. generally semiconductive materials, as well as blends or alloys of two or more such materials.

Embodiments of the present invention may also be applied to solar cells with the following features. By way of nonlimiting example, suitable organic materials for the P-type and/or N-type layer include conjugated polymers such as poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly (thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly (thienylenevinylene) and derivatives thereof, and poly (isothianaphthene) and derivatives thereof. Other suitable polymers include organometallic polymers, polymers containing perylene units, poly(squaraines) and their derivatives, and discotic liquid crystals. Other suitable organic materials include organic pigments or dyes, azo-dyes having azo chromofores (—N═N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d' eT]diisoquinoline-1,3,8,10-tetrone, and 2,9-Bis-(1-hexyl-hept-1-yl)-anthra[2,1,9-def:6,5,10-d' e' f]diisoquinoline-1,3,8,10-tetrone and pentacene, pentacene derivatives and/or pentacene precursors, an N-type ladder polymer such as poly(benzimidazobenzophenanthroline ladder) (BBL), or any combination of the above.

For any of the embodiments herein, it should be understood that the any of the types of protective layers may be used in single or multiple combination with one another. As a non-limiting example, Table I shows some possible combination of layer types used in combination over a solar cell. Other embodiments may combine all three types of layers in any order over the solar cell. In the embodiments combining all three types of layers, some may have multiple layers of the same material. Some three type and/or two type embodiments may have multiple layers of the same material such as alternating layers of organic and inorganic layers. Some may have two or more layers of one type of material and then at least one or more layers of a second type of material. In yet another embodiment, there may be only one type of material but multiple layers of that one material.

TABLE I

|  | Organic | Inorganic | Hybrid Organic/Inorganic |
|---|---|---|---|
| Organic | Organic/Organic | Organic/Inorganic | Organic/Hybrid |
| Inorganic | Inorganic/Organic | Inorganic/Inorganic | Inorganic/Hybrid |
| Hybrid Organic/Inorganic | Hybrid/Organic | Hybrid/Inorganic | Hybrid/Hybrid |

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A device comprising:
an individually encapsulated solar cell;
wherein the encapsulated solar cell includes at least one protective layer coupled to at least one surface of the solar cell and substantially impedes moisture from entering the solar cell;
wherein light passes through the protective layer to reach an absorber layer in the solar cell;
wherein the protective layer comprises a multi-layer film having one or more layers of a first material and one or more layers of a second material, wherein the multi-layer film contains randomly located pinholes or gaps at interfaces between layers that define long tortuous pathways that slow water penetration through the multi-layer film;
wherein a plurality of particles each sized between about 1 nm to about 10 microns which are contained in the multi-layer film of the protective layer to block tortuous pathways through the protective layer, wherein at least a portion of each of the particles is in contact with one of the layers of the first material or one of the layers of the second material and wherein most of the tortuous pathways are each blocked by at least one of the particles.

2. The device of claim 1 wherein the protective layer comprises of at least one material selected from the group consisting of: silica, alumina, aluminosilicates, diamond-like films, borosilicates, silicon nitride, aluminophosphosilicates, aluminophosphates Niobium oxide (Nb2Os), Niobium nitride (NbN), Zirconium Oxide (ZrO2), Zirconium Nitride (ZrN), Hafnium Oxide (HUO2), Hafnium nitride (HfN), Zinc oxide (ZnO), Yttrium oxide (Y2O3), Cerium Oxide (CeO2), Scandium Oxide (Sc2O3), Erbium oxide (Er2O3), Tantalum oxide (Ta2Os), Tantalum nitride (TaNx), Vanadium oxide (V2O5), Indium Oxide (In2O3), Aluminum nitride (A1N), Titanium Nitride (TIN), Molybdenum nitride (MoN), Gallium nitride (GaN), Lanthanum oxide (La2O3), Zinc Sulfide (ZnS), Tin oxide (SnO2), strontium sulfide (SrS), calcium sulfide (CaS), lead sulfide (PbS), indium tin oxide (ITO), tungsten oxide, calcium/titanium oxide, and/or combinations thereof.

3. The device of claim 1 wherein the protective layer comprises a nanolaminate comprised of at least one material combination selected from the group consisting of: hafnium oxide/tantalum oxide, titanium oxide/tantalum oxide, titania/alumina, zinc sulfide/alumina, ATO, A1TiO, and/or combinations thereof.

4. The device of claim 1 wherein the first material comprises a first inorganic material and the second material comprises a second organic material.

5. The device of claim 1 wherein the protective layer comprises a layer of silica layer and a layer of alumina.

6. The device of claim 1 wherein the protective layer comprises a plurality of fused inorganic particles.

7. The device of claim 1 wherein the protective layer comprises a plurality of fused silica particles.

8. The device of claim 1 wherein the protective layer includes a layer deposited by atomic layer deposition.

9. The device of claim 1 wherein the protective layer comprises of a plurality of layers deposited by atomic layer deposition.

10. The device of claim 1 wherein the protective layer comprises a silico-acrylic composition.

11. The device of claim 1 wherein the solar cell is a non-silicon based solar cell.

12. The device of claim 1 wherein the solar cell is an amorphous silicon solar cell.

13. The device of claim 1 wherein the solar cell includes a copper-indium-selenide based alloy.

14. The device of claim 1 wherein the absorber layer comprises one or more inorganic materials from the group consisting of: titania (TiO2), nanocrystalline TiO2, zinc oxide (ZnO), copper oxide (CuO or Cu2O or CuxOy), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium sulfide(CdS), copper sulfide (Cu2S), cadmium telluride (CdTe), cadmium-tellurium selenide (CdTeSe), copper-indium selenide (CuInSe2), cadmium oxide (CdOx), CuI, CuSCN, a semiconductive material, or combinations of the above.

15. The device of claim 1 wherein the absorber layer comprises one or more organic materials from the group consisting of: a conjugated polymer, poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof, 2,2'7,7'tetrakis(N,N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, a Ruthenium-based dye, a liquid iodide/triiodide electrolyte, azo-dyes having azo chromofores (—N=N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f]diisoquinoline-1,3,8,10-tetrone, and 2,9-Bis-(1-hexyl-hept-1-yl)-anthra[2,1,9-def:6,5,10-d'e'f]diisoquinoline-1,3,8,10-tetrone and pentacene, pentacene derivatives and/or pentacene precursors, an N-type ladder polymer, poly(benzimidazobenzophenanthroline ladder) (BBL), or combinations of the above.

16. The device of claim 1 wherein the absorber layer comprises one or more materials from the group consisting of: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, C60 and/or other small molecules, or combinations of the above.

17. The device of claim 1 wherein the absorber layer comprises one or more materials from the group consisting of: a nanostructured layer having an inorganic porous template with pores filled by an organic material (doped or undoped), a polymer/blend cell architecture, a micro-crystalline silicon cell architecture, or combinations of the above.

18. The device of claim 1 wherein the protective layer fully encapsulates the solar cell.

19. The device of claim 1 wherein the protective layer covers a top surface and all side surfaces of the solar cell.

20. The device of claim 1 wherein the protective layer covers a top surface, a bottom surface, and all side surfaces of the solar cell.

21. The device of claim 1 wherein the protective layer has a water vapor transmission rate (WVTR) sufficiently low so that there is substantially no loss in solar cell conversion efficiency when the cell is exposed for 1000 hours at 85° C. and 85% relative humidity.

22. The device of claim 1 wherein the protective layer has a WVTR such that the conversion efficiency of a cell with the protective layer has a conversion efficiency at least 25% better than an unprotected cell after both are exposed for 1000 hours at 85° C. and 85% relative humidity.

23. The device of claim 1 wherein the protective layer has a WVTR of about $10^{-3}$ g/m$^2$/day or less.

24. The device of claim 1 further comprising an anti-reflective layer above the protective layer.

25. The device of claim 1 wherein the protective layer has anti-reflective qualities.

26. The device of claim 1 wherein the particles are comprised of a material selected from the group consisting of: silica, glass, or other transparent inorganic materials.

27. The device of claim 1 wherein the particles have a shape selected from the group consisting of: spherical, platelet, or flake.

28. The device of claim 1 wherein the particles are sized to be within 5-10% of each other.

* * * * *